US012580602B2

(12) United States Patent
Parsian et al.

(10) Patent No.: US 12,580,602 B2
(45) Date of Patent: Mar. 17, 2026

(54) ACCESSORY SUPPORT DEVICES FOR ELECTRONIC DEVICES

(71) Applicant: Apple Inc., Cupertino, CA (US)

(72) Inventors: Mohammadali Parsian, San Mateo, CA (US); Fiona P. O'Leary, Palo Alto, CA (US); David A. Kleeman, Marina del Rey, CA (US); John F. Wadsworth, Burbank, CA (US); Mitchell Suckle, Long Beach, CA (US); Tom Kwon, Redondo Beach, CA (US); Peter Schmidt, Los Angeles, CA (US)

(73) Assignee: Apple Inc., Cupertino, CA (US)

( * ) Notice: Subject to any disclaimer, the term of this patent is extended or adjusted under 35 U.S.C. 154(b) by 612 days.

(21) Appl. No.: 17/934,477

(22) Filed: Sep. 22, 2022

(65) Prior Publication Data

US 2023/0396280 A1 Dec. 7, 2023

Related U.S. Application Data

(60) Provisional application No. 63/365,828, filed on Jun. 3, 2022.

(51) Int. Cl.
*H04B 1/3877* (2015.01)
*H05K 5/02* (2006.01)

(52) U.S. Cl.
CPC ......... *H04B 1/3877* (2013.01); *H05K 5/0217* (2013.01)

(58) Field of Classification Search
CPC ............................ H04B 1/3877; H05K 5/0217
(Continued)

(56) References Cited

U.S. PATENT DOCUMENTS 8,229,295 B2 * 7/2012 Wu ...................... G03B 17/566
396/533
8,757,461 B2 6/2014 Zanetti
(Continued)

FOREIGN PATENT DOCUMENTS

WO 2012166114 A1 12/2012

OTHER PUBLICATIONS

Etsy.com, "Laptop Cell Phone Mount; Mobile phone stand for top of laptop; Face height cellular phone holder", https://www.etsy.com/listing/910931418/laptop-cell-phone-mount-mobile-phone?ga_order=most_relevant&ga_search_type=all&ga_view_type=gallery&ga_search_query=phone+laptop+holder&ref=sr_gallery-1-5&frs=1&col=1, 2022 Etsy.Inc., pp. 1-14.

*Primary Examiner* — Mark G. Pannell
(74) *Attorney, Agent, or Firm* — BAKERHOSTETLER

(57) ABSTRACT
This application relates to accessory support devices for supporting portable electronic devices in relation to other electronic computing devices. A multi-part clip includes a housing having a first housing part having a first surface, a second housing part coupled to the first housing part and having a second surface, and an internal volume. The multi-part clip has a circular, ring-shaped magnetic element disposed within the internal volume and forms, through the second surface, a magnetic attachment to a magnetic element of a portable electronic device. The multi-part clip includes a hook-like appendage pivotably coupled to the first surface and has a recess such that, in an actuated configuration, the hook-like appendage extends away from the first surface and the recess is configured to receive a portion of an electronic computing device. The multi-part clip is balanced atop the electronic computing device according to a gravitational force imparted therein.

6 Claims, 21 Drawing Sheets

(58) Field of Classification Search
USPC ....................................................... 455/575.1
See application file for complete search history.

(56) References Cited

U.S. PATENT DOCUMENTS

| 10,564,671 | B1* | 2/2020 | Romo ................... G06F 1/1632 |
| 2004/0253132 | A1* | 12/2004 | Cho ................. H04M 1/72409 |
| | | | 417/572 |
| 2007/0001071 | A1* | 1/2007 | Yeh ........................ F16M 11/14 |
| | | | 248/179.1 |
| 2011/0243547 | A1* | 10/2011 | Khamsepoor ......... G03B 17/04 |
| | | | 396/428 |
| 2013/0048817 | A1* | 2/2013 | Wang ................... F16M 13/022 |
| | | | 29/428 |
| 2015/0011265 | A1* | 1/2015 | Walsh, Jr. ............. G06Q 40/04 |
| | | | 455/569.1 |
| 2015/0044938 | A1* | 2/2015 | Chieffo ................. A63H 33/26 |
| | | | 446/256 |
| 2015/0185771 | A1* | 7/2015 | Clark ........................ F03G 5/06 |
| | | | 307/154 |
| 2016/0277552 | A1* | 9/2016 | Scully .................... F16M 13/02 |
| 2017/0023752 | A1* | 1/2017 | Isenhour .............. G02B 3/0087 |
| 2017/0201194 | A1* | 7/2017 | Hahn .................... H02N 15/00 |
| 2017/0264725 | A1* | 9/2017 | Holder ............... B60R 11/0241 |
| 2018/0008044 | A1* | 1/2018 | Holt ..................... G06F 1/1605 |
| 2019/0064878 | A1* | 2/2019 | Corbin .................. A45C 11/00 |
| 2019/0139396 | A1* | 5/2019 | Cruver ................ G08B 25/016 |
| 2019/0349459 | A1* | 11/2019 | Cha ........................ H04R 1/023 |
| 2020/0062191 | A1* | 2/2020 | Ragner ............. H04B 1/3877 |
| 2020/0163240 | A1* | 5/2020 | Lee ....................... A45F 5/1516 |
| 2020/0412853 | A1* | 12/2020 | Zhu ...................... H04N 23/68 |
| 2021/0057937 | A1* | 2/2021 | Adra ...................... H02J 50/10 |
| 2021/0195398 | A1* | 6/2021 | Baldree ............. G08B 21/0297 |
| 2022/0228707 | A1 | 7/2022 | Ng |
| 2023/0134656 | A1* | 5/2023 | Smolka ............. G02B 13/0075 |
| | | | 359/665 |

* cited by examiner

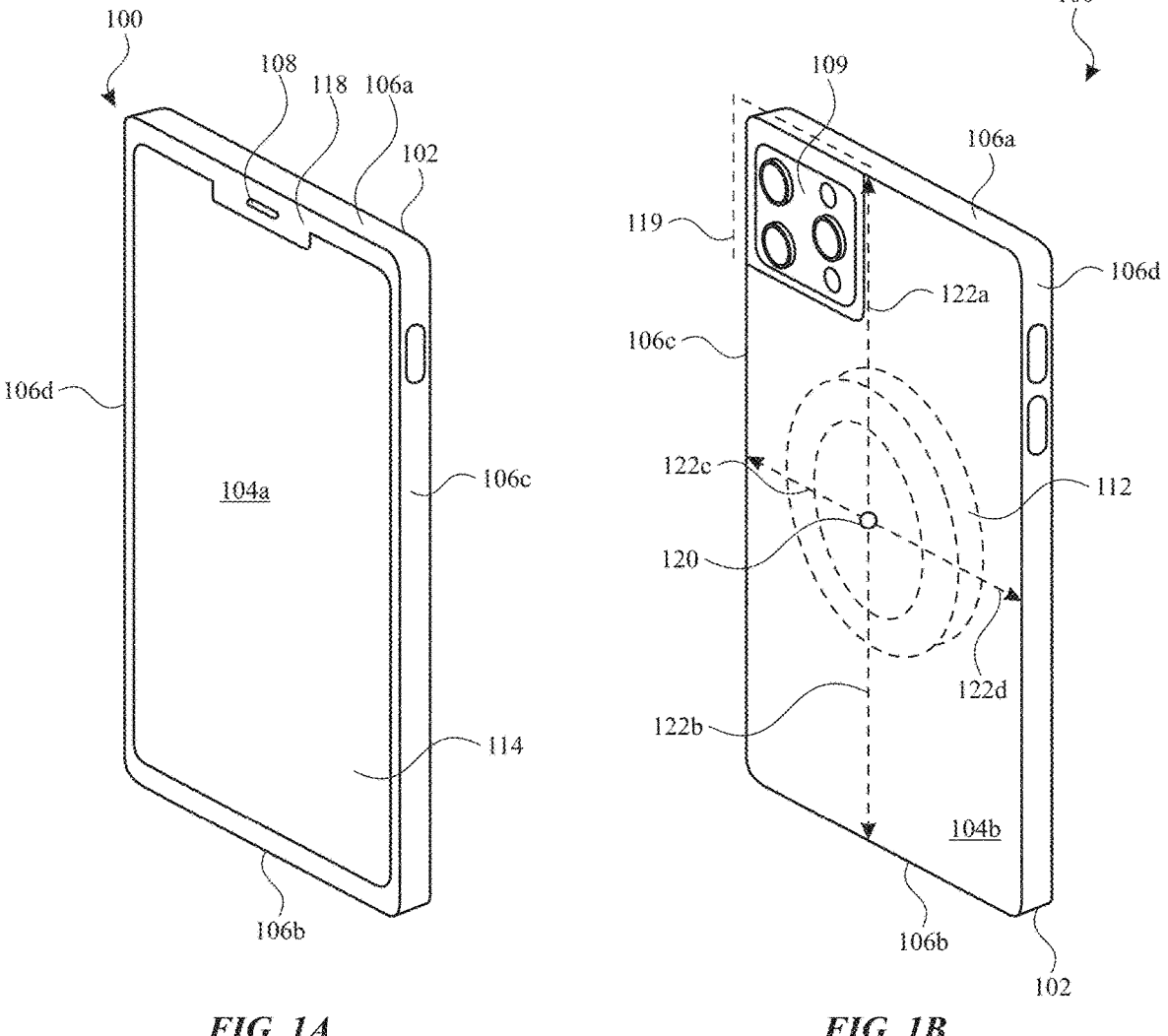
FIG. 1A                    FIG. 1B

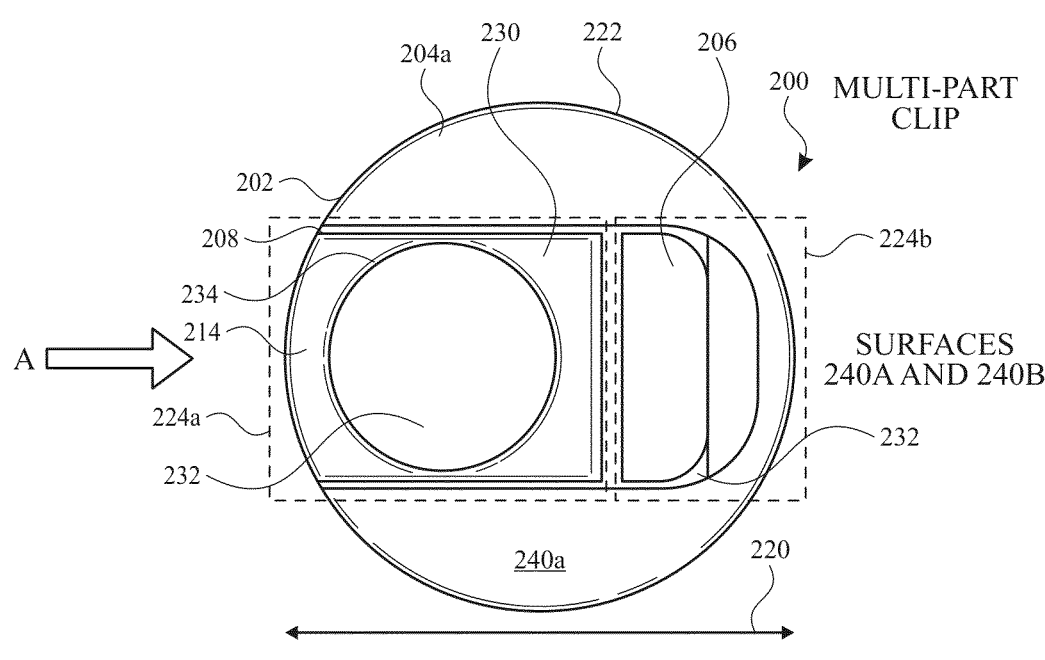
*FIG. 2A*
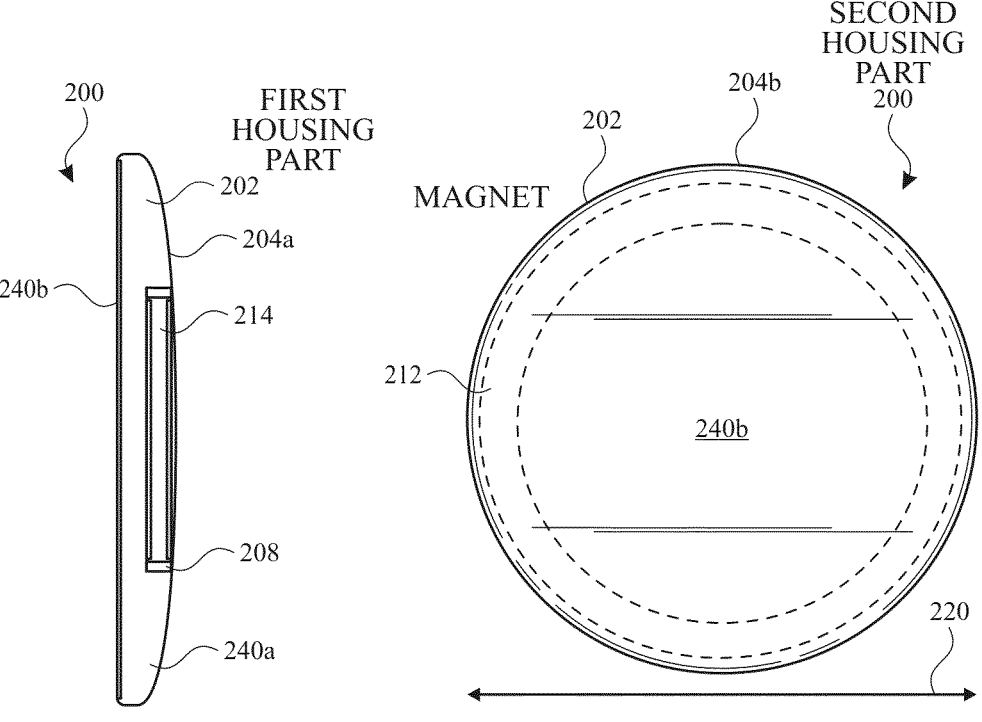
*FIG. 2B*                    *FIG. 2C*

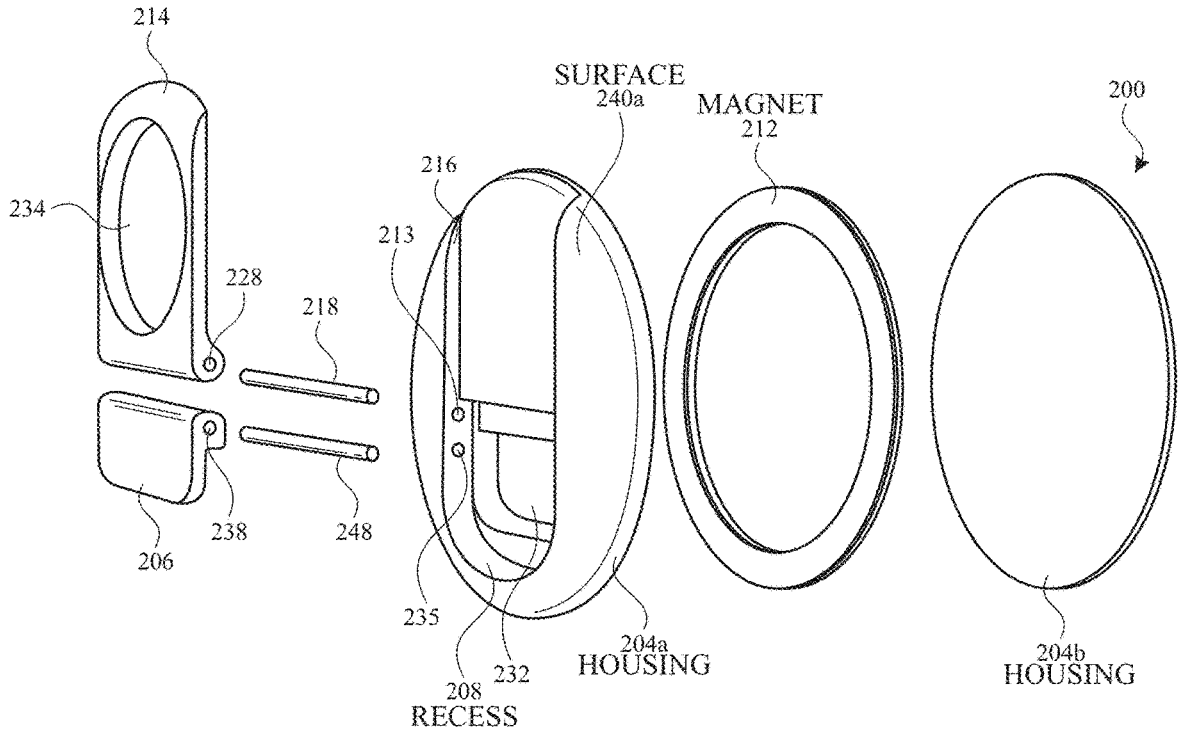
FIG. 2D
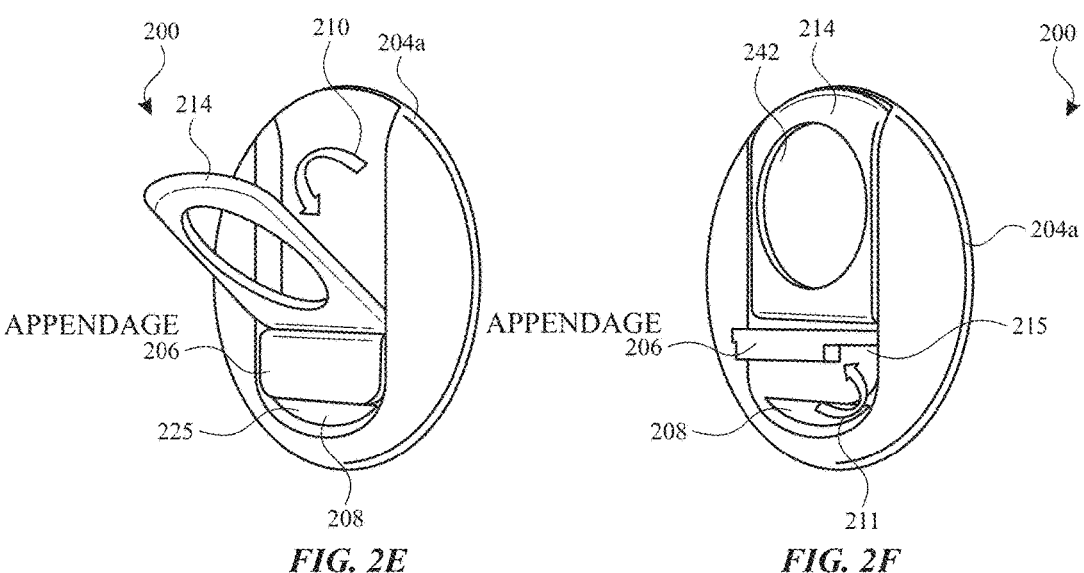
FIG. 2E            FIG. 2F

APPENDAGE
206 MULTI-PART
CLIP
200

100

104b

214

258

208
RECESS

100

109

208

400

214

206

225

200

248

104b

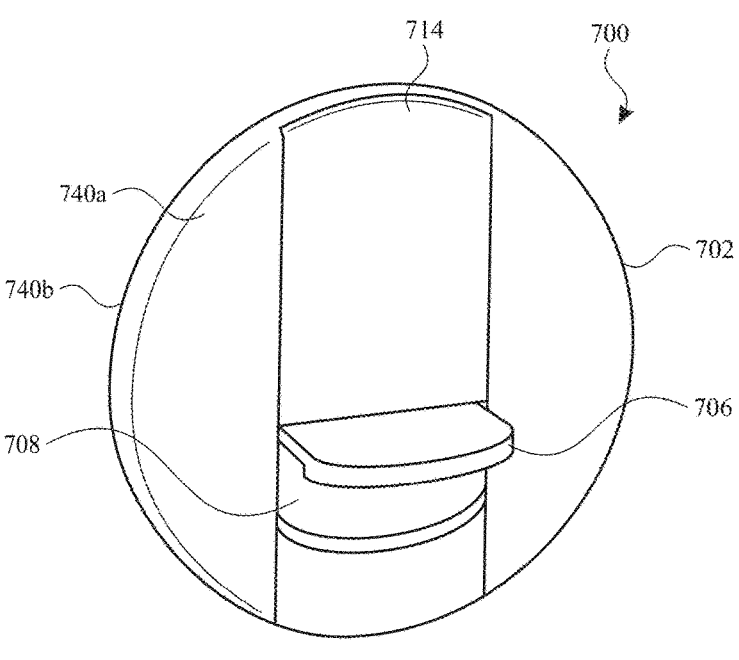
*FIG. 9A*
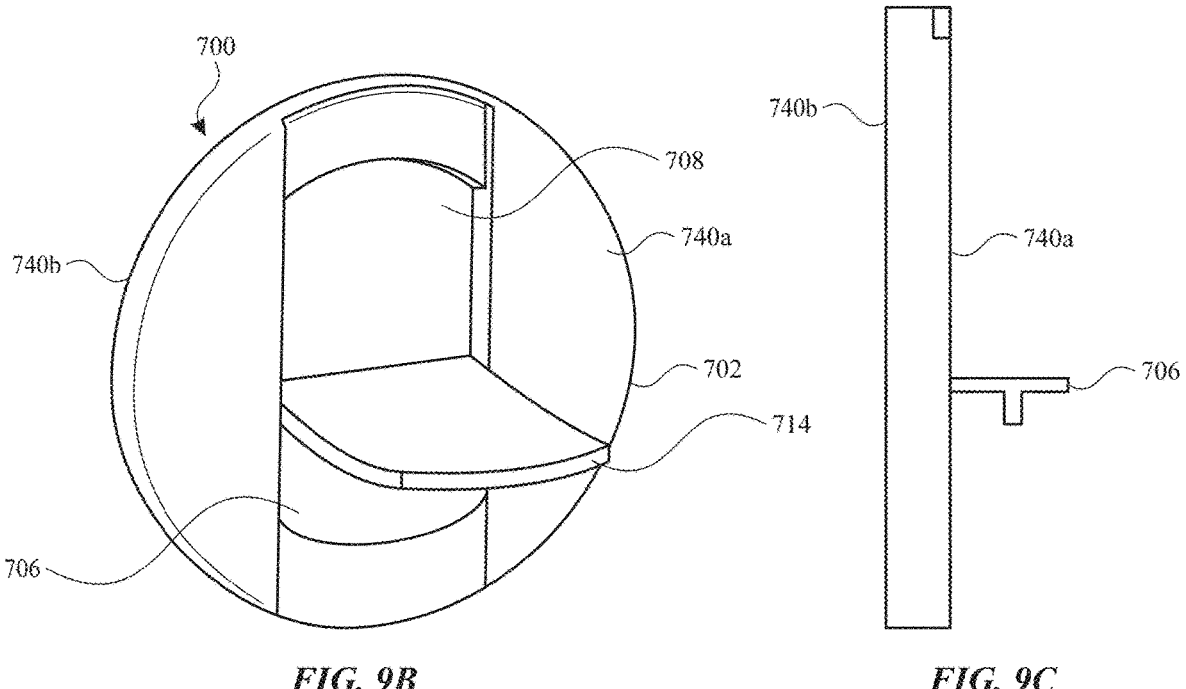
*FIG. 9B*                                        *FIG. 9C*

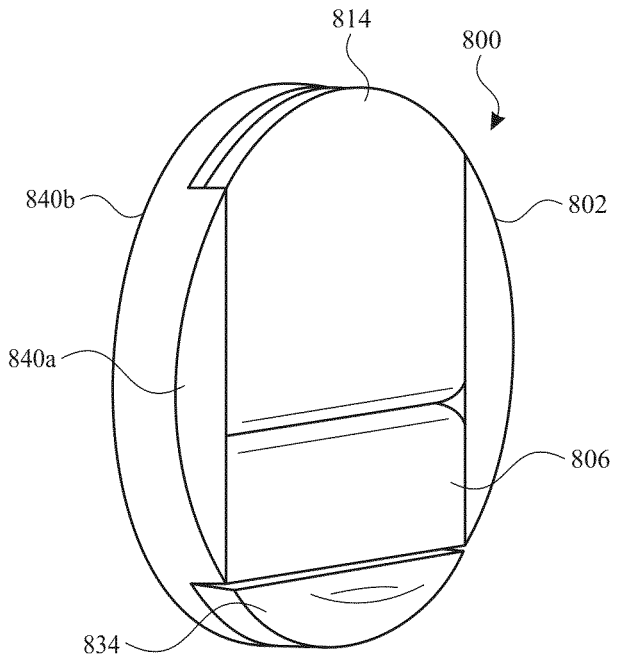
FIG. 10A
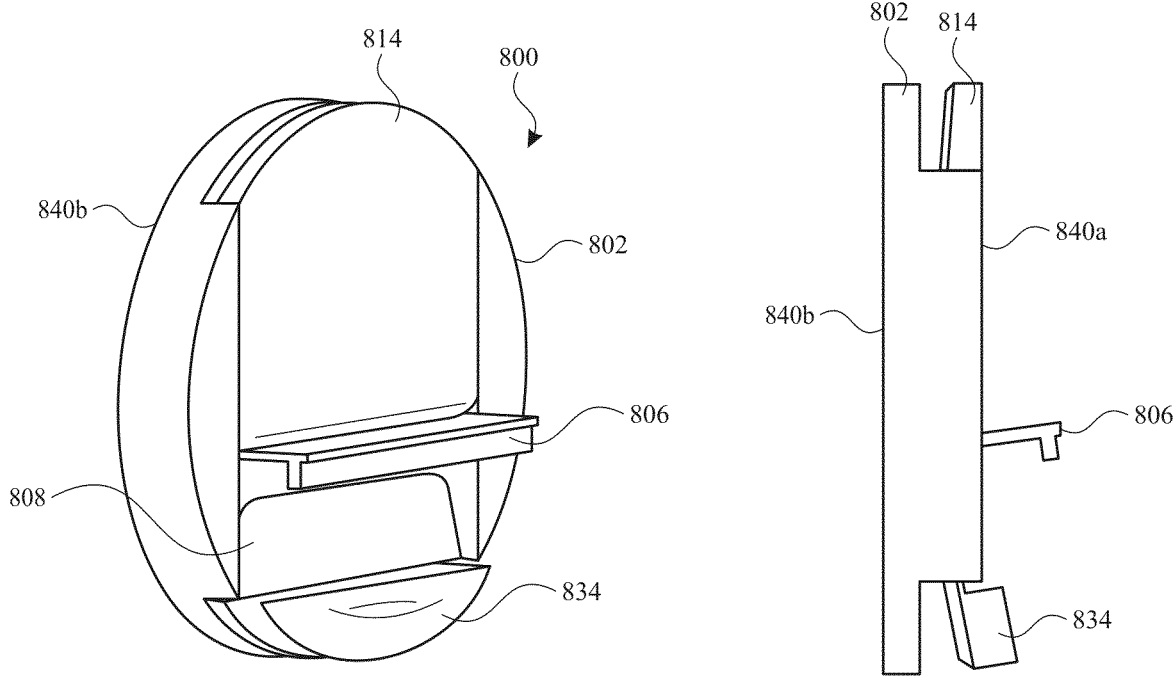
FIG. 10B                      FIG. 10C

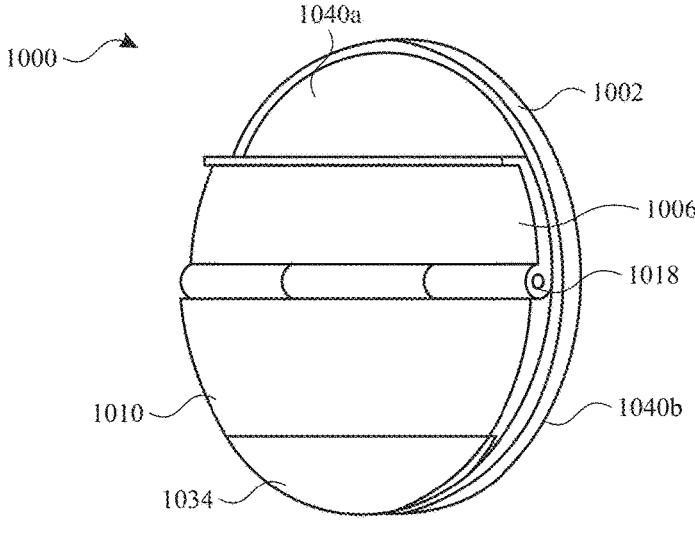
FIG. 12A
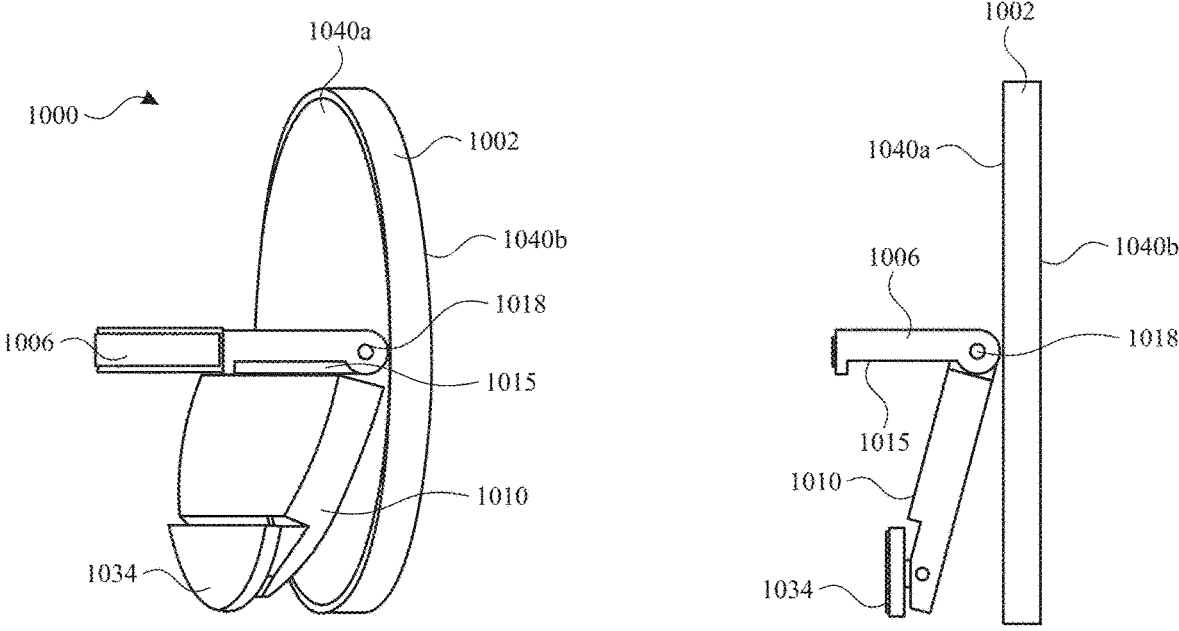
FIG. 12B             FIG. 12C

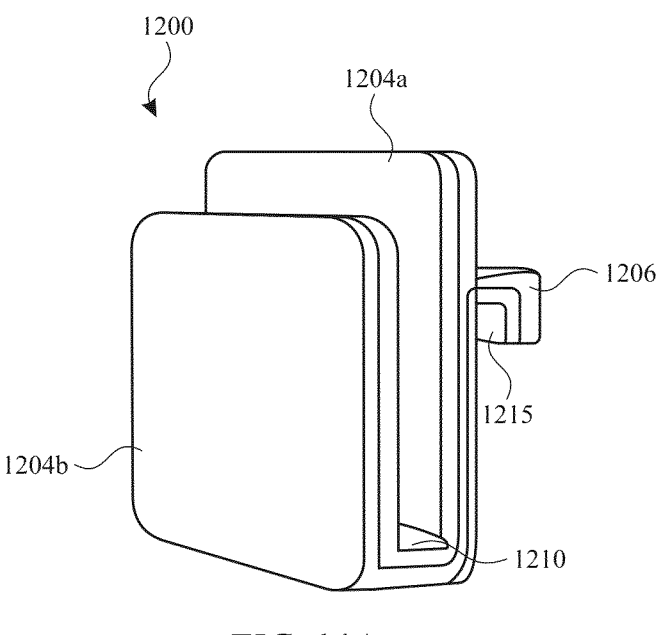
FIG. 14A
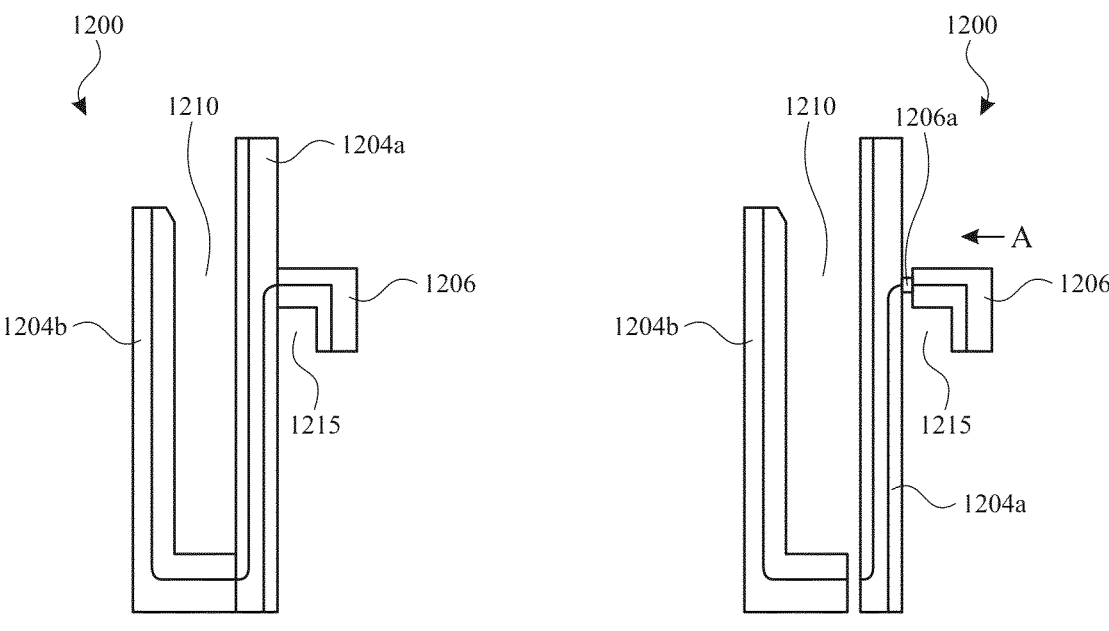
FIG. 14B
FIG. 14C

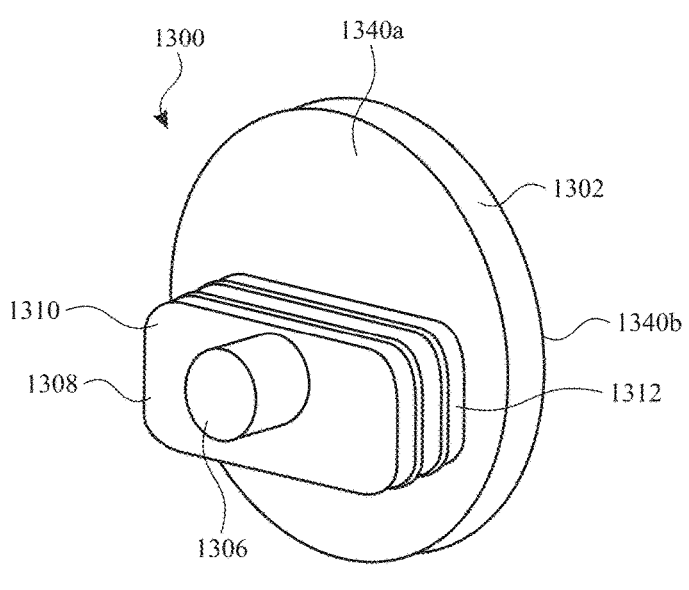
FIG. 15A
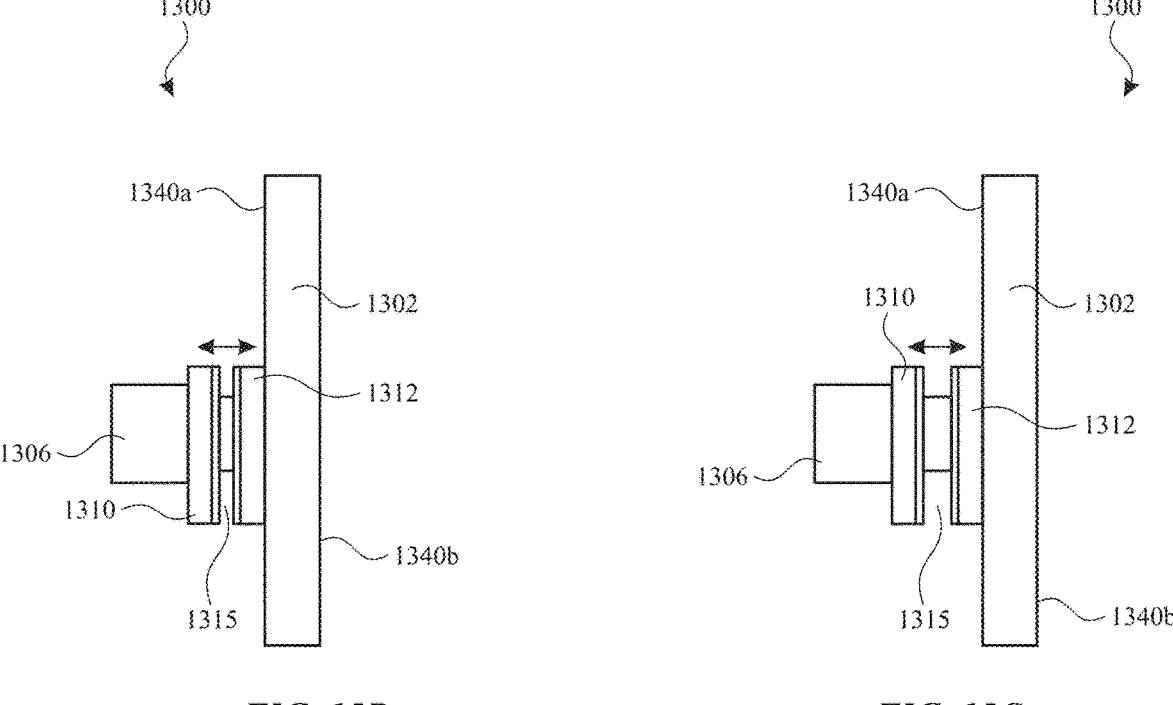
FIG. 15B          FIG. 15C

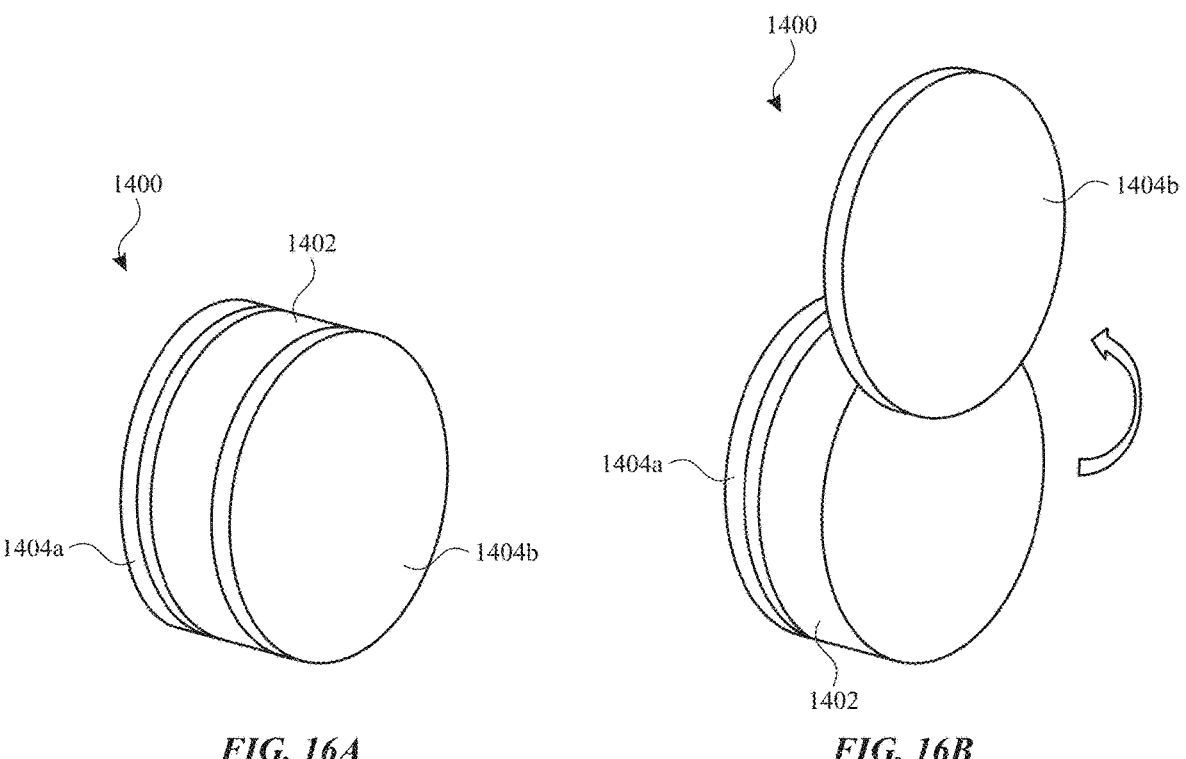
FIG. 16A
FIG. 16B
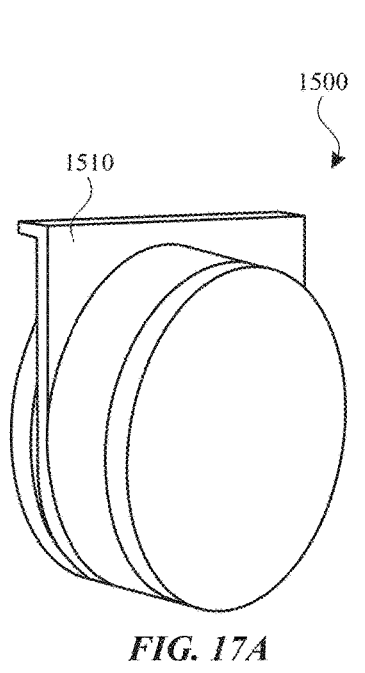
FIG. 17A
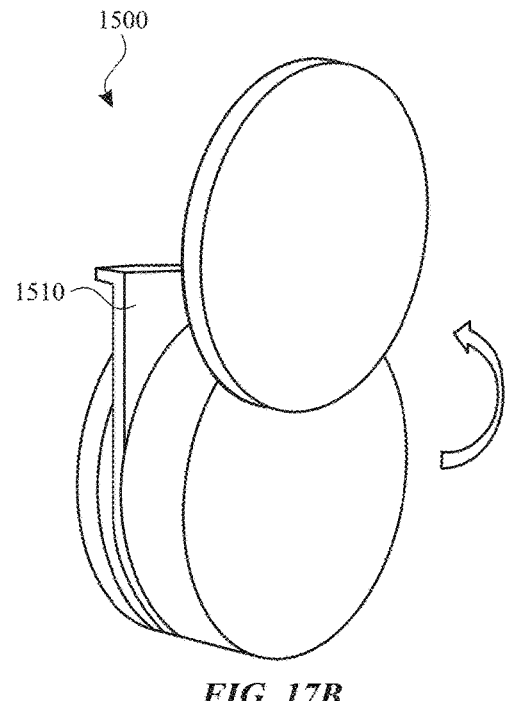
FIG. 17B

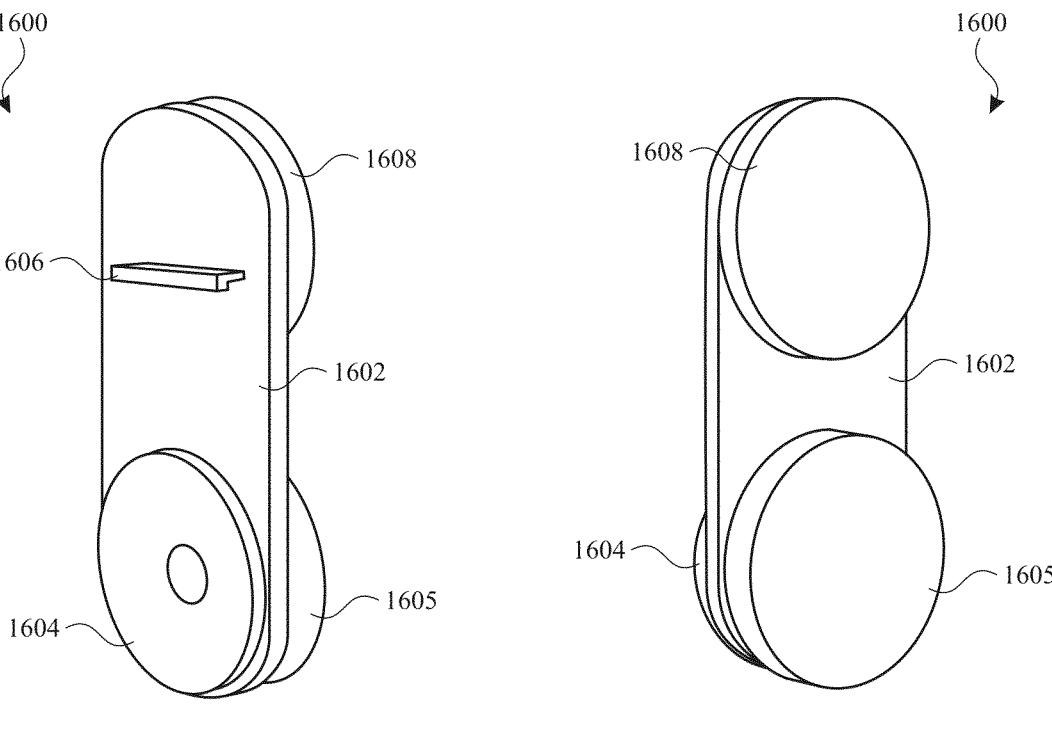
*FIG. 18A*                    *FIG. 18B*
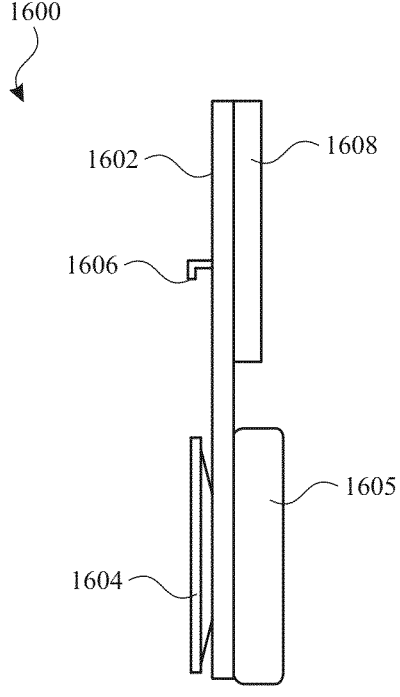
*FIG. 18C*

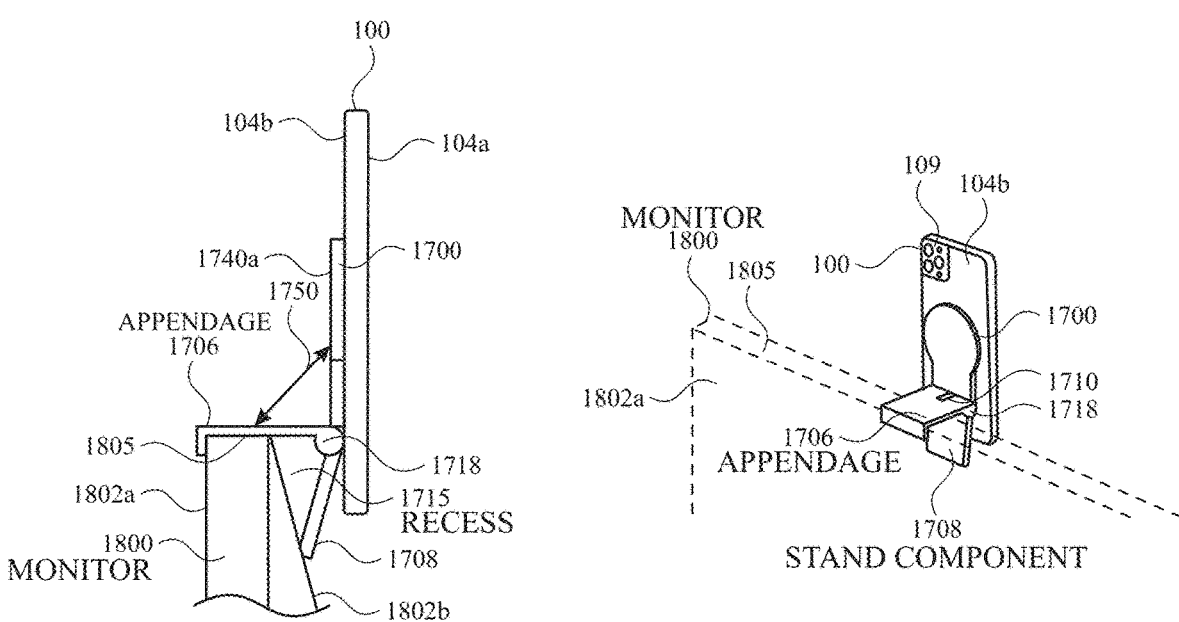
*FIG. 20A*                           *FIG. 20B*
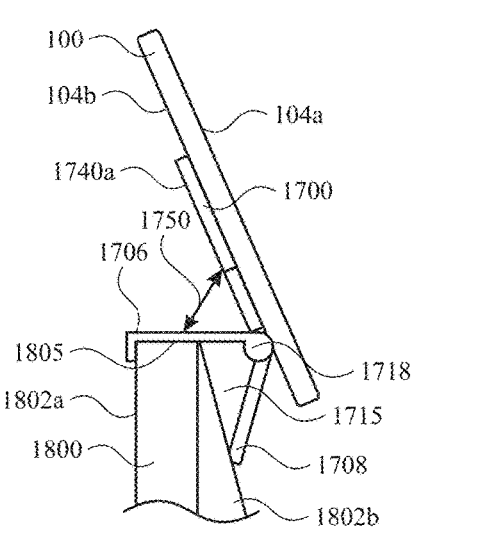                 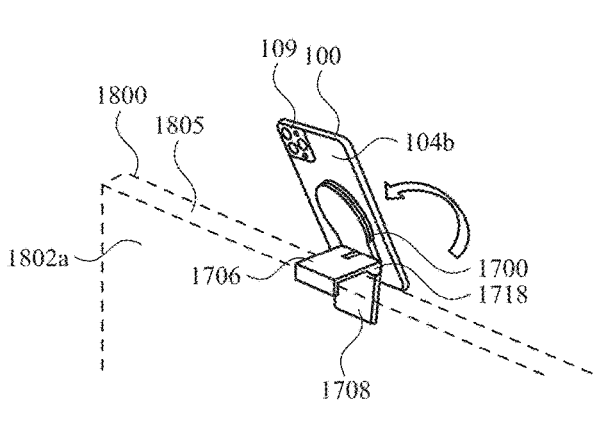
*FIG. 21A*                           *FIG. 21B*

ACCESSORY SUPPORT DEVICES FOR ELECTRONIC DEVICES

CROSS-REFERENCE TO RELATED APPLICATIONS

The present application claims the benefit of U.S. Provisional Application No. 63/365,828, entitled "ACCESSORY SUPPORT DEVICES FOR ELECTRONIC DEVICES," filed Jun. 3, 2022, the content of which is incorporated herein by reference in its entirety for all purposes.

FIELD

The following description relates to accessory support devices. In particular, the following description relates to stands, supports, and mounts that can be used with portable electronic devices.

BACKGROUND

Portable electronic devices, such as mobile phones and tablets, are increasingly advanced in their sheer computing power and utility due to recent improvements in both their technical and design aspects. As a result, these portable electronic devices, in certain environments, may be considered a suitable rival to the larger scale, and less portable, other electronic computing devices, such as laptops, personal computers (PCs), smart televisions, vehicle navigation and/or entertainment units, etc. In such instances, a user might conceivably decide to entirely substitute one of these other electronic computing devices with a portable electronic device, or to use the two electronic devices interchangeably as a matter of personal preference. In addition, portable electronic devices are also used cooperatively with other electronic computing devices. In such instances of interoperability, it may be functionally and ergonomically beneficial to securely position the portable electronic device in an accessible, reachable, and viewable position alongside, or in close proximity to, the other electronic computing device(s). This convenience is particularly useful in circumstances when a user is mainly in a stationary position (e.g., when seated at a work surface) and for lengthy periods of time while operating the electronic device(s).

Further, as mentioned above, in some cases, a portable electronic device may be functionally interoperable and/or structurally engaged with one or more separate electronic computing device(s). For example, one or more functions or features of a portable electronic device may be used in conjunction with another electronic computing devices to form an interoperable system. Accordingly, in certain instances, a portable electronic device may be capable of unilaterally or bilaterally transmitting and/or receiving information to and from the other electronic computing device(s) using, for example, one-way and/or two-way electronic communication methods and protocols established between the several electronic computing devices. Such communication pathways may comprise a wired connection and/or a wireless connection. Suitable examples of a wired connection may include Ethernet, USB-A, USB-C, micro-USB, and lightening cables. Further, suitable examples of a wireless connection may include Wi-Fi, Bluetooth®, ZigBee®, Near-Field Communications (NFC), and a cellular data network, etc. By interconnecting a portable electronic device with other separate electronic computing devices in this manner, various capacities and capabilities specific to each of the electronic devices may be advantageously leveraged such that, together, the multiple electronic devices form a single collective system that is highly-optimized. For example, as mentioned above, many portable electronic devices are, characteristically, easily transportable because of their relatively compact size and shape, as well as their light weight. However, a prominent drawback of the purposeful compactness of portable electronic devices is a corresponding limitation in the amount of feasible data storage capacity relative to the larger data storage capacities of other electronic computing devices. Therefore, in some instances, a portable electronic device may benefit from the ability to transfer particular types of data to a separate electronic computing device for longer term storage, thereby beneficially alleviating the data storage burden of the portable electronic device.

In another ubiquitous example, various portable electronic devices are considered a valuable photography and videography tool due to their compactness and portability, and, importantly, on account of the vast improvements made to the camera systems and camera functions, as well as the processing circuitry and user-friendly content capturing and editing applications. In some instances, the high quality photo and video output of various portable electronic devices may be comparable or superior to professional-grade cameras and recording equipment. Thus, when performing any function with an electronic computing device that involves a camera or a video capturing mechanism (e.g., video conferencing, real-time or pre-recorded broadcasting, and multimedia content editing, etc.), utilizing the high quality camera and/or video functionality of a portable electronic device in connection with the electronic computing device may be preferable. On the other hand, certain attributes (e.g., the larger dimensions, higher-scale resolution, etc.) of, for example, a display feature of the electronic computing device (e.g., a laptop screen or a free-standing computer monitor) may exceed the comparable features of the portable electronic device. In such examples, utilizing the camera and/or video features of the portable electronic device in tandem with, for example, a display feature of the electronic computing device may provide an optimal operating and visualizing environment for the performance of routine and ordinary tasks, such as video conferencing or videotelephony operations, as well as for the creation of more complex forms of multimedia content.

In order to effectively use a portable electronic device physically alongside, or in connection with, other electronic computing device(s), it is practical to be able to prop up and support the portable electronic device in an elevated upright, or in a semi-upright, position in relation to a user such that the user can easily and instinctively access and view the portable electronic device while also being within operating reach of the other electronic computing device(s). Accordingly, there exists support devices that, when structurally engaged with a portable electronic device, support the portable electronic device in a user's desired position. However, these existing support devices suffer from several disadvantages. For example, the support device is an added loose component that must be transported along with the portable electronic device. Further, many existing support devices require that they be placed on, and secured to, an underlying surface sufficiently clear of other objects and substantially flat (or otherwise level) in order to adequately provide their support function. Thus, the range of environments in which the support device may be used is limited. In another example, certain existing support devices include a pole element that, in a manner that is reminiscent of a music stand configuration, can extend the height of the position of the supported portable electronic device to a desired height or location. For example, a user may wish to position the portable electronic device at eye level. In some instances, the pole element is telescoping such that its length can be adjusted. However, a pole element, or an extension, adds bulk and complexity, making the support device less durable over time and harder to manipulate, carry, and store. Further, when the pole element is deployed or extended, the support device may become cumbersome and easily knocked over. Also, such a support devices frequently impede the field of vision of the user and other persons in the vicinity.

In another example, various existing support devices for portable electronic devices rely on a gripping element that actively grips onto a supporting or underlying surface (e.g., a furniture piece, a wall, a vehicle dashboard, etc.) to steady and secure the support device. Similarly, some existing support devices rely on a mounting element that is mounted to a supporting surface. However, over the lifetime of these support devices, frequent mechanical stress is placed on the gripping or mounting elements, thereby causing them to significantly weaken over time due to wear and tear. Furthermore, the gripping or mounting elements may damage the underlying or supporting surface.

In a further example, various structural mechanisms employed by the majority of existing support devices that structurally engage and/or secure the portable electronic device thereto, oftentimes, when engaged, restrict the portable electronic device to only a single orientation. As a result, the portable electronic device must first be removed from the support device (and subsequently reengaged) in order to make even slight or basic adjustments to the orientation of the portable electronic device (e.g., shift between a landscape orientation and a portrait orientation). Also, the structural mechanisms for engaging and securing the portable electronic device at the support device may, in some instances, obstruct a usable or functional portion of the portable electronic device, or cause structural damage to the portable electronic device.

Thus, there is a significant need for a support device that is compact and easily adjustable, and effectively engages and positions a portable electronic device into a desired position relative to a user and, in some circumstances, in cooperative engagement with other electronic computing devices, while leaving little to no footprint with respect to the portable electronic device and any other structure. Accordingly, in the following description, several exemplary embodiments of such support devices for use with portable electronic devices are discussed and depicted in greater detail.

SUMMARY

This paper describes various exemplary embodiments that relate to accessory support devices for supporting portable electronic devices in relation to other electronic computing devices.

According to some embodiments of the present disclosure, a multi-part clip is described. The multi-part clip may be configured to support a portable electronic device with respect to an electronic computing device. The multi-part clip includes a multi-part housing, wherein the multi-part housing includes: (i) a first housing part having a first surface, (ii) a second housing part coupled to the first housing part and having a second surface opposite the first surface, and (iii) an internal volume. In addition, the multi-part clip includes a magnetic element disposed within the internal volume and configured to form, through the second surface, a magnetic attachment to a magnetic element of a portable electronic device. Further, the multi-part clip includes a hook-like appendage pivotably coupled to the first surface and comprising a recess such that, in an actuated configuration of the hook-like appendage, the hook-like appendage extends away from the first surface and the recess is configured to receive a portion of an electronic computing device such that the multi-part clip is balanced atop the electronic computing device according to a gravitational force being imparted on the multi-part clip. Also, according to some embodiments of the present disclosure, the multi-part housing is in a shape of a circular disc. Further, the hook-like appendage is pivotably coupled to the first surface by a hinge assembly. Additionally, according to certain embodiments of the present disclosure, the first surface of the first housing part comprises a housing recess having an interior region, and the hook-like appendage is pivotably coupled to the interior region of the housing recess such that, when in an unactuated configuration, the hook-like appendage is fully seated within the housing recess. Further, according to certain embodiments of the present disclosure, the multi-part clip further comprises a support stand positioned adjacent to the hook-like appendage and pivotably coupled to the interior region of the housing recess such that: (i) in an unactuated configuration, the support stand is fully seated within the housing recess, and (ii) in an actuated configuration, the support stand extends away from the first surface. In addition, according to certain embodiments of the present disclosure, the magnetic element comprises a set of discrete magnets disposed in a ring shape.

According to certain exemplary embodiments of the present disclosure, there is described a multi-part clip for receiving a portable electronic device having a magnetic element. The multi-part clip may include a first part that includes: (i) a planar support portion capable of directly supporting the portable electronic device, wherein the planar support portion is defined, in pail, by opposite first and second edges, (ii) a lip support portion capable of providing lip support to the planar support portion, wherein the lip support portion extends away from and perpendicular to the planar support portion at the first edge, and (iii) a notch that extends through the planar support portion from the second edge to a center portion of the planar support portion. In addition, the multi-part dip may include a second part pivotably coupled to the planar support portion at the second edge, wherein the second part is capable of providing, in concurrence with the lip support, an adjustable angular support such that the planar support portion is perpendicular to a reference orientation. Further, the multi-part clip may include an attachment part having a body having (i) a first portion, (ii) a second portion that includes a first magnetic element, and (iii) a tab coupled to the first portion and movable within the notch, wherein when the tab moves within the notch, the second portion is capable of movement, that is: (i) parallel to the planar support portion and (ii) aligned with only a portion of the portable electronic device corresponding to the magnetic element. In addition, according to some embodiments of the present disclosure, the portable electronic device includes a camera assembly. Also, according to certain embodiments of the present disclosure, the planar support portion is capable of supporting the camera assembly in the reference orientation. Further, according to some embodiments of the present disclosure, the planar support portion is supported by a display housing of a display screen of a computer. In addition, according to some embodiments of the present disclosure, the reference orientation is generally perpendicular to the display screen. Also, according to certain embodiments of the present disclosure, the reference orientation is generally adjustable in relation to the display screen.

According to some exemplary embodiments of the present disclosure, there is described a multi-part clip for supporting a portable electronic device having a magnetic element. The multi-part clip may include a first part that includes a planar support portion that is defined, in part, by an edge, wherein the planar support portion is capable of providing support to the portable electronic device, the planar support portion having a notch that extends from the edge to a center portion of the planar support portion. Further, the multi-part clip may include a second part that is pivotably coupled to the planar support portion at the edge, wherein the second part is capable of providing an adjustable angular support to the planar support: portion. In addition, the multi-part clip includes an attachment part having a body that includes (i) a first portion having a first magnetic element, and (ii) a second portion, coupled to the first portion, that includes an alignment feature sized to fit and move within the notch in a manner parallel to the planar support portion such that the first magnetic element is aligned with the magnetic element. Further, according to certain embodiments of the present disclosure, the multi-part clip further comprises a lip support portion capable of providing lip support to the planar support portion, wherein lip support portion extends away from and perpendicular to the planar support portion at the edge, and till) a notch that extends through the planar support portion from the edge to a center portion of the planar support portion. Also, in some embodiments of the present disclosure, the second part is capable of providing, in concurrence with the lip support, an adjustable angular support such that the planar support portion is perpendicular to a reference orientation. Further, according to certain embodiments of the present disclosure, the alignment feature is a tab that is coupled to the first portion and is movable within the notch, wherein when the tab moves within the notch, the second portion is capable of movement that is: (i) parallel to the planar support portion and (ii) aligned with only a portion of the portable electronic device corresponding to the magnetic element. Additionally, according to some embodiments of the present disclosure, the planar support portion is perpendicular to a reference orientation. Also, according to certain embodiments of the present disclosure, the planar support portion may be supported by a display housing of a display screen of a computer. Further, according to certain embodiments of the present disclosure, the reference orientation is generally perpendicular to the display screen.

Other aspects and advantages of the invention will be apparent from the following detailed description taken in conjunction with the accompanying drawings, which illustrate, by way of example, the principles of the described embodiments.

This summary is provided merely for purposes of summarizing some example embodiments to provide a basic understanding of some aspects of the subject matter described herein. Therefore, it will be appreciated that the above-described features are merely examples and should not be construed to narrow the scope or spirit of the subject matter described herein in any way. Other features, aspects, and advantages of the subject matter described herein will become apparent from the following detailed description, figures, and claims.

BRIEF DESCRIPTION OF THE DRAWINGS

The disclosure will be readily understood by the following detailed description in conjunction with the accompanying drawings, wherein like reference numerals designate like structural elements.

FIG. 1A illustrates an isometric view of an exemplary embodiment of a portable electronic device, according to a first viewpoint;

FIG. 1B illustrates an isometric view of the portable electronic device of FIG. 1B, according to a second viewpoint;

FIG. 2A illustrates a top view of an exemplary embodiment of a multi-part clip;

FIG. 2B illustrates a side view of the multi-part clip of FIG. 2A;

FIG. 2C illustrates a bottom view of the multi-part clip of FIG. 2A;

FIG. 2D illustrates an exploded view of the multi-part clip of FIG. 2A;

FIG. 2E illustrates an isometric view of the multi-part clip of FIG. 2A, in which a support stand component thereof is in an actuated configuration or position;

FIG. 2F illustrates an isometric view of the multi-part clip of FIG. 2A, in which a support hook-like appendage or projection thereof is in an actuated configuration or position;

FIGS. 9A-9C illustrate an alternative embodiment of a multi-part clip;

FIGS. 10A-10C illustrate an alternative embodiment of a multi-part clip;

FIGS. 12A-12C illustrate an alternative embodiment of a multi-part clip;

FIGS. 14A-14C illustrate an alternative embodiment of a multi-part clip;

FIGS. 15A-15C illustrate an alternative embodiment of a multi-part clip;

FIGS. 16A-16B illustrate an alternative embodiment of a multi-part clip;

FIGS. 17A-17B illustrate an alternative embodiment of a multi-part clip;

FIGS. 18A-18C illustrate an alternative embodiment of a multi-part clip;

FIG. 20A illustrates a side view of the multi-part clip of FIG. 19A, wherein the multi-part clip is seated at and/or on a separate electronic computing device and coupled to the portable electronic device of FIG. 1A while the portable electronic device is in a portrait orientation;

FIG. 20B illustrates a perspective view of the multi-part clip of FIG. 20A, in situ;

FIG. 21A illustrates a side view of the multi-part clip of FIG. 20A, wherein the multi-part clip is tilted at an angle;

FIG. 21B illustrates a perspective view of the multi-part clip of FIG. 21A, in situ;

DETAILED DESCRIPTION

Figure 2G:
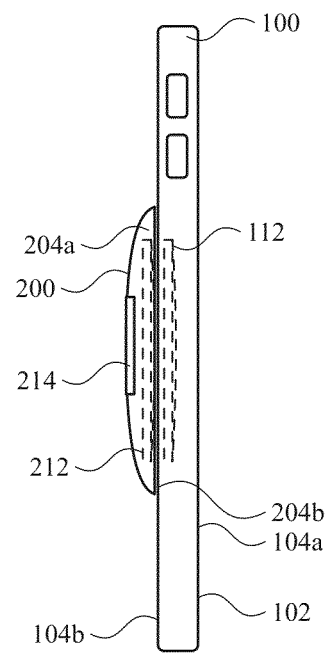
FIG. 2G illustrates a side view of the multi-part clip of FIG. 2A, in which the multi-part clip is coupled to the portable electronic device of FIG. 1A.
Figure 2H:
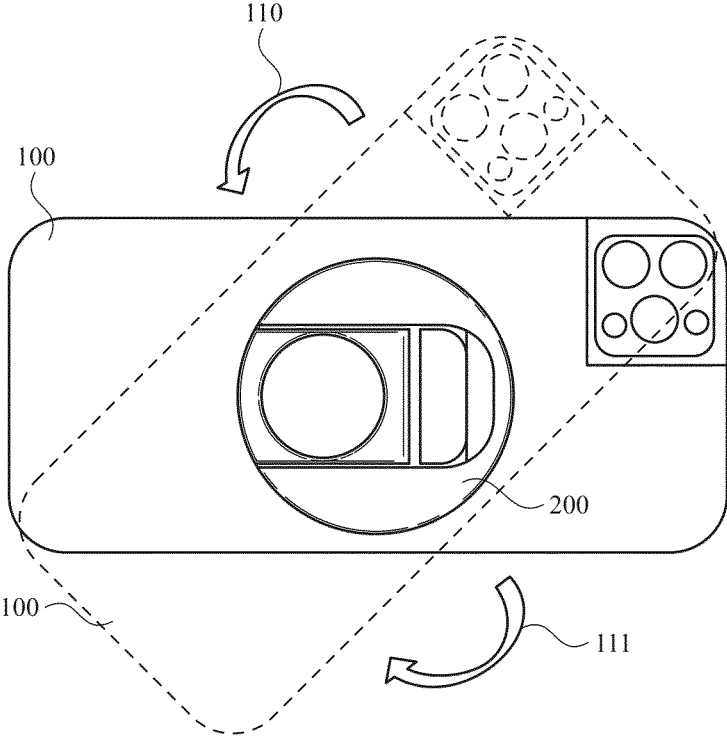
FIG. 2H illustrates a swiveling and/or rotating movement of the portable electronic device of FIG. 1A relative to the multi-part clip of FIG. 2A, while the portable electronic device is coupled to the multi-part clip of FIG. 2A.

Reference will now be made in detail to the representative embodiments that are illustrated in the accompanying drawing figures. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the embodiments described herein. Although these embodiments are described in sufficient detail to enable one skilled in the art to practice the described embodiments, it is understood that these examples are not limiting such that other embodiments may be used, and alterations may be made, without departing from the spirit and scope of the described embodiments.

As mentioned above, this application is directed to accessory support devices for supporting and positioning a portable electronic device in relatively close proximity to other electronic computing device(s), such that the portable electronic device may be easily accessed, viewed, and used alongside, or in operational connection with, the other electronic computing device(s). As non-limiting examples, portable electronic devices that are described herein may refer to mobile phones, smartphones, and tablet computing devices. In addition, as non-limiting examples, other electronic computing devices that are described herein may refer to desktop computing devices, laptop computing devices, portable electronic devices, and display devices (e.g., laptop display screens, free-standing display monitors, flat screen televisions, etc.). The exemplary embodiments of the accessory support devices that are shown and described herein provide an enhanced simplicity, portability, physical compactness, durability, and adjustability, and can be used in a broad array of environments. Further, as is discussed in detail below, the manner in which, according to the exemplary embodiments described, the accessory support device engages both a portable electronic device and a supporting structure, does not cause any structural damage or cosmetic damage to the portable electronic device and the supporting structure.

Certain exemplary embodiments of accessory support devices described herein may include a multi-part clip that is capable of structurally engaging a back surface of a portable electronic device such that the portable electronic device is secured at the multi-part clip. Furthermore, the multi-part clip may include a downward-facing hook-like appendage or projection that has a recess shaped to receive a horizontal portion of the outer periphery of a separate electronic device (e.g., a topmost edge of the frame of a laptop screen or free-standing computer monitor) such that the multi-part clip can then be seated on (or atop) the electronic computing device. Accordingly, the multi-part clip effectively hangs in a balanced and stable manner from the horizontal portion of the electronic computing device due to the gravitational force imparted on the multi-part clip and the portable electronic device. Therefore, in this way, the electronic computing device itself constitutes the supporting surface that supports the combined assembly of the multi-part clip and the portable electronic device. As a result, use of the multi-part clip does not require a flat or substantially level surface that is firm and suitably clear of other objects. Rather, the multi-part clip may be used in any environment in which the separate electronic computing device is present, even in circumstances in which no other supporting surfaces are present or are available outside of what is provided by the separate electronic computing device.

In some exemplary embodiments, the structural engagement between the multi-part clip and a back surface of a portable electronic device is non-invasive, thereby preventing the multi-part clip from causing any structural damage or any blemishes to the portable electronic device. For example, the structural engagement may be in the form of a magnetic attachment. Further, in another example, the structural engagement may be in the form of a suction force or vacuum force. In a further example, the structural engagement may comprise or involve an additional recess of the multi-part clip, wherein the recess is shaped to receive a portion of the portable electronic device such that, when the multi-part clip is in use, the portable electronic device is securely seated or ensconced within the recess. Accordingly, the portable electronic device is safely retained therein.

Further, according to some exemplary embodiments, the hook-like appendage or projection of the multi-part clip may be retracted or collapsed towards, or to a location that is within, a main body of the multi-part clip when the hook-like appendage or projection is not deployed. As a result, the multi-part clip may have a compact, smooth, and slim exterior and profile when the hook-like appendage or projection is not in use.

Additionally, according to several exemplary embodiments, the multi-part clip may allow for in situ adjustments to the positioning of the portable electronic device without first requiring that the portable electronic device be disengaged or removed from the multi-part clip before being repositioned and subsequently reengaged with the multi-part clip. For example, as described in greater detail below, according to some embodiments, the structural engagement between the multi-part clip and, for example, a back surface of a portable electronic device may allow for the portable electronic device to be manually rotated or swiveled an unbridled 360° degrees while the portable electronic device remains engaged with the multi-part clip. This maneuverability allows for the portable electronic device to be shifted between, for example, a portrait orientation and a landscape orientation. In other embodiments, the portable electronic device may be manually rotated or swiveled as just described, but according to a limited or restricted range of motion that is less than a complete 360° degrees. In a further example, according to some embodiments, the hook-like appendage or protrusion of the multi-part clip is coupled, either directly or indirectly, to a main body of the multi-part clip at, or by way of, a rotatable or pivotable joint (e.g., a hinge assembly, etc.). As such, when the multi-part clip is supporting a portable electronic device, the portable electronic device may then be manually rotated or pivoted with respect to the main body of the multi-part clip. Thus, an angle that is formed between the portable electronic device and the main body of the multi-part clip may be adjusted in situ such that the portable electronic device may be tilted or pitched towards and/or away from a user.

Further, as mentioned above, as a result of the significant developments in the photographic and videographic capabilities of, for example, the camera, audio, and processing components of portable electronic devices, the use of these portable electronic devices as influential multimedia capturing tools is widespread and frequent. In consideration of this prevalent use, the precise point of coupling or attachment between the hook-like appendage or projection relative to the main body of the multi-part clip is such that, according to some embodiments, the resulting placement of the multi-part clip (and, by extension, the portable electronic device) when the multi-part clip is seated at a supporting surface, ensures that components of the portable electronic device needed to accomplish its photographic and/or videographic functions are not physically obstructed by any part of the multi-part clip and the underlying supporting surface. For example, in circumstances in which a portable electronic device includes one or more camera lens assemblies that are exposed at an area of its external surface, the position of the hook-like appendage or projection relative to the main body of the multi-part clip may be determined such that the one or more camera lens assemblies are automatically and invariably positioned above, or away from, the multi-part clip and the underlying support surface (e.g., the top edge of a laptop screen). Similarly, the position of the hook-like appendage or projection relative to the main body of the multi-part clip may be specifically chosen to ensure that the frame of any image or video captured by the one or more camera lens assemblies is properly oriented and composed and will not inadvertently include a portion of, for example, the supporting surface.

Accordingly, these and other exemplary embodiments are discussed below with reference to FIGS. 1A-1B, 2A-2H, 3, 4, 5A-5B, 6, 7A-7B, 8A-8B, 9A-9C, 10A-10C, 11A-11B, 12A-12C, 13A-13B, 14A-14C, 15A-15C, 16A-16B, 17A-17B, 18A-18C, 19A-19B, 20A-20B, 21A-21B, 22A-22B, and 23A-23B. However, those that are skilled in the art will readily appreciate that the detailed description given herein and with respect to these figures is for explanatory purposes only and should not be construed as limiting.

FIGS. 1A-1B depict isometric views of an exemplary embodiment of a portable electronic device 100. As depicted, the portable electronic device 100 may be in the form of a mobile wireless communication device. Examples of mobile wireless communication devices include, but are not limited to, mobile telephones, smartphones, and tablet devices.

Portable electronic device 100 may include a housing 102, that provides an internal volume (or storage location) for several internal components of portable electronic device 100. Housing 102 may comprise a metal housing that is composed of one or more of aluminum, stainless steel, or a metal alloy or metal composite. Alternatively, housing 102 may be formed from one or more non-metals. In order to establish points of reference for the following description, FIG. 1A may be defined as depicting portable electronic device 100 according to a first viewpoint. Further, FIG. 1B may be defined as depicting portable electronic device 100 according to a second viewpoint, wherein the second viewpoint is opposite the first viewpoint. Further, portable electronic device 100 may include several surfaces or sides. For example, as illustrated in FIG. 1A, the housing 102 may include a first surface 104a that lies perpendicular to four side surfaces, i.e., 106a, 106b, 106c, and 106d. Further, side surface 106a is positioned opposite from and parallel to side surface 106b. Additionally, side surface 106c is positioned opposite from and parallel to side surface 106d. In the viewpoint depicted in FIG. 1B, the four side surfaces 106a, 106b, 106c, and 106d are also shown. Further, also shown in FIG. 1B is a second surface 104b of housing 102, wherein the second surface 104b is located opposite from and parallel to the first surface 104a. According to this particular embodiment, the first surface 104a may be characterized as a forward facing surface from the perspective of a user who is operating the portable electronic device. Thus, the first surface 104a may comprise a display surface 114 by which a user can interact with and control various functions of the portable electronic device 100. By extension, second surface 104b may be characterized as a rearward facing surface or a back surface of portable electronic device 100. Again, for purposes of establishing points of reference in view of the following discussion, side surfaces 106a, 106b, 106c, and 106d may also be referred to herein as first, second, third, and fourth side surfaces, respectively. Each of surfaces 104a, 104b, 106a, 106b, 106c, and 106d may constitute separate parts of housing 102 that are subsequently assembled together to form housing 102 during the manufacturing process. Alternatively, the surfaces 104a, 104b, 106a, 106b, 106c, and 106d comprise a single integral fabricated piece that is subsequently molded into a pre-determined desired form (such as the shape that is depicted in FIGS. 1A and 1B) during the manufacturing process.

Further, according to some exemplary embodiments, portable electronic device 100 may include one or more input and/or output ("I/O") connectors or ports (not shown) (e.g., a Universal Serial Bus ("USB") port) at its housing 102 (e.g., at any of the surfaces 104a, 104b, 106a, 106b, 106c, and 106d) that permit wired communication with, for example, separate electronic computing device(s) and/or an external power source. Additionally, the portable electronic device 100 may include one or more components (not shown) within the housing 102 for establishing wireless communication with one or more separate electronic computing device(s). Such components may include, but are not limited to, one or more antennas that are used to conduct short-range radio frequency ("RF") communications.

Also with reference to the exemplary embodiment depicted in FIGS. 1A and 1B, portable electronic device 100 may further include one or more camera assemblies that capture and/or record photographic images and video. In certain embodiments, the camera assemblies may include one or more camera lens assemblies (e.g., lens assemblies 108 and 109 shown in FIGS. 1A and 1B), which, as shown, are necessarily exposed to the external environment. According to this particular embodiment, the camera lens assembly 108 is positioned at a region 118 of surface 104a, wherein region 118 is in relatively close proximity to side surface 106a. Further, the camera lens assembly 109 is positioned at a corner region 119 of surface 104b.

Furthermore, as described in greater detail below, the portable electronic device 100 may comprise one or more magnetic elements that may be positioned at one or more locations within housing 102. According to the exemplary embodiment of FIGS. 1A and 1B, portable electronic device 100 includes a magnetic element 112 positioned within housing 102. In this particular embodiment, the body of magnetic element 112 has a circular, ring-like shape and a center point 120. As depicted in FIG. 1B, magnetic element 112 may be precisely positioned within housing 102 such that the center point 120 is located at a desired distance 122a from the first side surface 106a, a distance 122b from the second side surface 106b, a distance 122c from the third side surface 106c, and a distance 122d from the fourth side surface 106d. Further, according to certain exemplary embodiments, magnetic element 112 may comprise a set or an array of discrete magnets (not shown) that are positioned adjacent, or in close proximity, to each other to form the circular, ring-like shape depicted in FIG. 1B.

Referring now to FIGS. 2A-2H, depicted therein is an exemplary embodiment of a multi-part clip 200 for supporting a portable electronic device, such as the portable electronic device 100 in FIGS. 1A and 1B. In this particular embodiment, the multi-part clip 200 is structurally engaged with and removably secured to a portable electronic device by way of a magnetic engagement. Beginning with FIG. 2A, there is depicted a top view of multi-part clip 200. Further, FIG. 2B depicts a side view of multi-part clip 200 when being viewed from a direction "A" (see FIG. 2A). In addition, FIG. 2C depicts a bottom view of multi-part clip 200. Thus, FIGS. 2A and 2C depict opposite faces of multi-part clip 200. As shown in FIGS. 2A through 2C, the multi-part clip 200 has a three-dimensional disc-like shape and comprises a circular housing 202 as one non-limiting example. The housing 202 may comprise any suitable shape and dimensions that permits the multi-part clip 200 to provide the function(s) described herein. For example, the housing 202 may be in the form of a three-dimensional cube or block having rectangular, square, or oval, etc., shaped surfaces or sides thereof. Further, housing 202 comprises a first housing part 204a and a second housing part 204b that is located opposite of first housing part 204a. As depicted, first housing part 204a has a first exterior surface 240a. Similarly, second housing part 204b has a second exterior surface 240b. According to some embodiments, first housing part 204a and second housing part 204b may be a single fabricated piece that is, for example, molded into a desired shape. Alternatively, in other embodiments, each of the first housing part 204a and the second housing part 204b constitutes a separate piece or structure. In such instances, the first and second housing parts 204a and 204b may be coupled to, or otherwise joined together, at a seam or a junction (not shown) to form the housing 202.

In addition, the first housing part 204a and the second housing part 204b may be comprised of one or more non-metal materials. Importantly, as discussed in detail below, the characteristics and/or properties of the material(s) that comprise at least the second housing part 204b must allow for a magnetic attraction to occur between a magnetic element of a portable electronic device (e.g., magnetic element 112 in the embodiment depicted in FIG. 1B) and a magnetic element 212 of the multi-part clip 200 (depicted in, for example, FIGS. 2C and 2D). Several non-limiting examples of suitable non-metal materials may include synthetic (and malleable) compounds, such as silicone, rubber, and other types of elastomers, as well as either synthetic or semi-synthetic polymers, such as plastic compounds, plastic composites, and resins. Furthermore, according to some exemplary embodiments, one or both of the first housing part 204a and the second housing part 204b may be constructed using a combination or an amalgamation of non-metal materials. For example, one of the housing parts (204a, 204b) may comprise a plastic base having an external silicone layer applied using various techniques, including thermal-based processes. For example, an external silicone layer may be applied to a plastic base using a liquid silicone rubber injection molding process (or "LSR").

Alternatively, according to other exemplary embodiments, first housing part 204a and/or second housing part 204b may be comprised of one or more metals.

Referring still to FIGS. 2A through 2C, circular housing 202 may define a diameter 220 and a circumference 222. Further, as depicted in FIGS. 2A and 2B, a recess or indentation 208 is formed, for example, along a center region of first surface 240a of the first housing part 204a. According to this particular embodiment, recess or indentation 208 has, for example, an oblong, stadium, or rectangular shape. In addition, the recess or indentation 208 has an interior region 232.

Additionally, as is described in detail below, one or more support components are housed or seated within recess or indentation 208. For example, with respect to this specific embodiment, the recess or indentation 208 includes a stand component 214 that is positioned within a first region 224a of the recess or indentation 208. According to this particular embodiment, the stand component 214 may be in the form of a pull-tab ring 230 that has a graspable aperture 234. The body and surface(s) of stand component 214 may be comprised of one or more highly durable materials. For example, according to some embodiments, the stand component 214 may be comprised of one or more metals and/or metal alloys. Examples of such metals include, but are not limited to, aluminum, steel, and a high polished chrome.

In addition, the recess or indentation 208 may include a hook-like appendage or projection 206 that is positioned within a second region 224b of recess or indentation 208. The hook-like appendage or projection 206 may be comprised of one or more non-metal materials. Illustrative examples of suitable non-metal materials include, but are not limited to, silicone, rubber, plastics, and resins.

As mentioned above and depicted in FIG. 2C, multi-part clip 200 may include a magnetic element 212 that is located within housing 202. In this particular view, the magnetic element 212 is depicted in dotted lines to indicate that it is positioned within housing 202 and is not visible from the outside of the multi-part clip 200. According to this specific embodiment, magnetic element 212 has a circular, ring-like shape. Also, the dimensions and the shape of magnetic element 212 are identical to, or are substantially identical to, the dimensions and the shape of, for example, magnetic element 112 of portable electronic device 100 (which was described above and depicted in FIGS. 1A and 1B). Further, according to certain exemplary embodiments, magnetic element 212 may comprise a set or an array of discrete magnets (not shown) positioned adjacent, or in close proximity, to each other to form the circular, ring-like shape depicted in FIG. 2C.

Referring now to FIG. 2D, there is shown an exploded view of multi-part clip 200 of FIGS. 2A through 2C, which provides a general illustration of several constituent parts of the multi-part clip 200 in a disassembled state. As depicted, first housing part 204a and second housing part 204b together form housing 202 of the multi-part clip 200. Further, a magnetic element 212 is enclosed within housing 202 and, specifically, is positioned, for example, within first housing part 204a. Alternatively, magnetic element 212 may be positioned within second housing part 204b.

Referring still to FIG. 2D, as described above, the first surface 240a of first housing part 204a includes a recess or indentation 208, wherein a stand component 214 and a hook-like appendage or projection 206 are positioned within an interior region 232 of the recess or indentation 208. Stand component 214 may be affixed to the interior region 232 of recess or indentation 208 at a pivotable attachment such that the stand component 214 may pivot with respect to the first housing part 204a of multi-part clip 200. According to this particular embodiment, stand component 214 is affixed to the interior region 232 of recess or indentation 208 by a hinge assembly. Specifically, when assembled, the hinge assembly comprises, for example, a cylindrical hinge pin 218 (or dowel) inserted into a through bore 228 of stand component 214. In addition, in order to affix or couple the stand component 214 to the first housing part 204a, a first end of the cylindrical hinge pin 218 is matingly inserted into a corresponding first aperture 213 that is located on a first side wall 216 of interior region 232. Likewise, a second end of hinge pin 218 is matingly inserted into a corresponding (second) aperture (not shown) that is located directly across and opposite from the aperture 213 and on a second side wall (not shown) of the interior region 232.

Similarly, the hook-like appendage or projection 206 may be affixed to the interior region 232 of the recess or indentation 208 at a pivotable attachment such that the hook-like appendage or projection 206 is also capable of pivoting with respect to first housing part 204a. Specifically, with respect to this particular embodiment, the hook-like appendage or projection 206 is affixed to the interior region 232 of recess or indentation 208 by a hinge assembly. For example, as depicted in FIG. 2D, the hinge assembly, when assembled, comprises a cylindrical hinge pin 248 (or dowel) inserted into a through bore 238 of hook-like appendage or projection 206. Further, in order to affix or couple the hook-like appendage or projection 206 to the first housing part 204a, a first end of the cylindrical hinge pin 248 is matingly inserted into a corresponding third aperture 235 that is located on the first side wall 216 of interior region 232. Additionally, in an identical manner, a second end of the cylindrical hinge pin 248 is matingly inserted into a corresponding (fourth) aperture (not shown) that is located directly across and opposite from the aperture 235 and on the second side wall (not shown) of interior region 232.

Accordingly, as a result of the pivotable attachments described immediately above, each of the stand component 214 and hook-like appendage or projection 206 are capable of pivoting relative to the first housing part 204a. In accordance with the embodiment set forth in FIGS. 2A through 2D above, FIGS. 2E and 2F provide a general illustration of this pivoting movement. As shown in FIG. 2E, the stand component 214 is in an actuated or a deployed configuration or position in which the stand component 214 is pivoted outward or away from recess or indentation 208 of the first housing part 204a. By contrast, hook-like appendage or projection 206 is in an unactuated or a seated configuration or position in which no pivoting movement has occurred and hook-like appendage or projection 206 remains within recess or indentation 208 of first housing part 204a. Conversely, FIG. 2F illustrates the circumstance in which the hook-like appendage or projection 206 is in an actuated or a deployed position or configuration, whereby the hook-like appendage or projection 206 is pivoted outward or away from the recess or indentation 208. In addition, the stand component 214 is in an unactuated or seated configuration or position in which no pivoting movement has occurred and the stand component 214 remains within the recess or indentation 208 of the first housing part 204a in a retracted or recessed state.

In addition, as shown in FIG. 2D, the hinge assembly 218, 228 affixing the stand component 214 to the interior region 232 of the recess or indentation 208 is located in close proximity to the hinge assembly 238, 248 affixing the hook-like appendage or projection 206 to the interior region 232 of the recess or indentation 208. Thus, as demonstrated in the FIGS. 2E and 2F, the stand component 214, in its actuated or its deployed configuration or position, is pivoted in a direction 210 towards the hook-like appendage or projection 206. Furthermore, the hook-like appendage or projection 206, in its actuated or deployed configuration or position, is pivoted in a direction 211 (i.e., opposite the direction 210) towards the stand component 214. Accordingly, none of the configurations or positions of the stand component 214 obstructs the pivoting movement of the hook-like appendage or projection 206. Likewise, none of the configuration or positions of the hook-like appendage or projection 206 obstructs the pivoting movement of the stand component 214.

Also, both the stand component 214 and the hook-like appendage or projection 206 may readily be manually accessed for displacement. For example, as mentioned above, stand component 214 may be in the form of a pull-tab ring that includes an aperture 234 that may be grasped by a user's hand. In addition, as depicted in, for example, FIGS. 2E and 2F, the stand component extends to, and forms, a part of the edge 242 (of circumference 222) of first housing part 204a such that a user can easily find and manipulate the stand component at the edge 242. Further, with respect to the hook-like appendage or projection 206, a section 225 of recess or indentation 208 that is adjacent or proximal to the hook-like appendage or projection 206 is continually exposed, even while hook-like appendage or projection 206 is in its unactuated or seated position within the recess or indentation 208. This exposed section 225 of the recess or indentation 208 provides a groove for a user to manually access the hook-like appendage or projection 206 by, for example, a finger. Further, the hinge assembly associated with the stand component 214 and/or the hinge assembly that is associated with the hook-like appendage or projection 206 may comprise a spring assembly (not shown) or spring mechanism (not shown). For example, according to some embodiments, either or both of the hinge assemblies may be spring-loaded and/or spring-biased by way of a bi-step spring (not shown). Accordingly, a user may manually release from, or change, the configuration or position (i.e., from actuated to unactuated and/or unactuated to actuated) of the stand component 214 and/or the hook-like appendage or projection 206 by depressing the stand component 214 and/or the hook-like appendage or projection 206 to overcome a biasing force imposed by the spring assembly or mechanism.

Further, according to this particular embodiment, the shape and dimensions of stand component 214 and hook-like appendage or projection 206 are such that, when the stand component 214 and the hook-like appendage or projection 206 are retracted into the recess or indentation 208 such that each is in its unactuated or its seated position or configuration, no part of the stand component 214 and the hook-like appendage and projection 206 protrudes from the first surface 240a of the first housing part 204a. Therefore, as shown in FIG. 2B, the multi-part clip 200 has a smooth, compact, and slim profile and exterior surface when the stand component 214 and the hook-like appendage and projection 206 are fully positioned within the recess or indentation 208.

In addition, according to certain embodiments, the hinge assembly that is associated with the stand component 214 and/or the hinge assembly that is associated with the hook-like appendage or projection 206 may include a friction element or friction component (not shown) that provides a degree of rigidity to the pivotable attachment between interior region 232 of the recess or indentation 208 and the stand component 214 and/or and the hook-like appendage or projection 206. As a result of the added rigidity to the hinge assembly, the hinge assembly is capable of maintaining an angle occurring between the first housing part 204a of the multi-part clip 200 and the stand component 214 and/or the hook-like appendage or projection 206 as generated by a pivoting movement of the stand component 214 and/or hook-like appendage or projection 206 in situ.

As mentioned above, the multi-part clip 200 is capable of impermanently and structurally engaging a surface of a portable electronic device and supporting that portable electronic device on an underlying supporting surface. Further, according to this particular embodiment, the structural engagement is a magnetic engagement or magnetic attachment. Depicted in FIG. 2G is an exemplary embodiment of a magnetic engagement or attachment occurring between the multi-part clip 200 and a portable electronic device (e.g., the portable electronic device 100 described above and pictured in FIGS. 1A and 1B). As shown in FIG. 2G, a surface 204b of multi-part clip 200 is selectively coupled to a surface 104b of the portable electronic device 100. According to this example, the magnetic engagement or attachment is achieved by aligning the magnetic element 112 of the portable electronic device 100 with the magnetic element 212 of the multi-part clip 200. Therefore, the magnetic engagement or attachment is temporary and the multi-part clip 200 may be subsequently disengaged from the portable electronic device 100.

Importantly, according to the magnetic properties of magnetic element 112 and/or magnetic element 212, the portable electronic device 100 and/or the multi-part clip 200 may be rotated with respect to the other without disengaging the magnetic engagement or attachment between the portable electronic device 100 and the multi-part clip 200. For example, as demonstrated in FIG. 2H, the portable electronic device 100 may be swiveled or rotated (e.g., between the direction of arrow 110, and/or in an opposite direction, i.e., the direction of arrow 111) relative to multi-part clip 200, while in situ and while the multi-part clip 200 remains stationary. Thus, angular adjustments may be made to the orientation of the portable electronic device 100 while the portable electronic device 100 is supported by the multi-part clip 200. For example, the portable electronic device 100 may be readily switched between a landscape (or horizontal) orientation and a portrait (or vertical) orientation when engaged with the multi-part clip 200. This capability is particularly useful and applicable when operating the portable electronic device.

Figure 3:
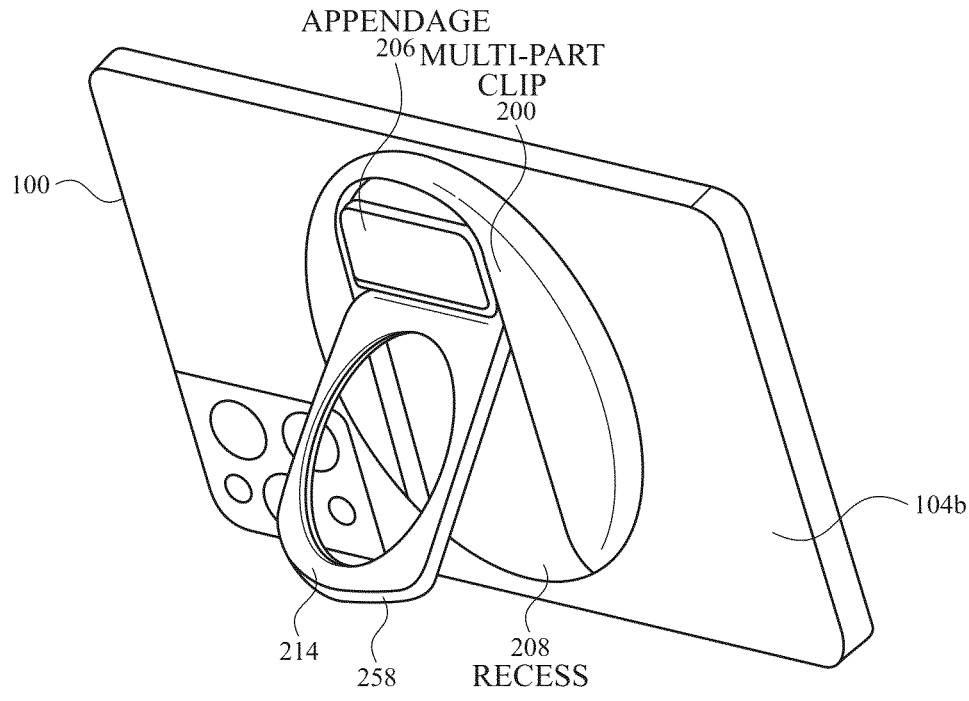
FIG. 3 illustrates the support stand component of the multi-part clip of FIG. 2A while in situ.

With respect to FIG. 3, there is depicted an actuated or deployed configuration or position of stand component 214 in situ, according to the particular embodiment of FIGS. 2A through 2H. As shown, multi-part clip 200 is magnetically engaged with surface 104b of the portable electronic device 100. Further, the stand component 214 is pivoted outward from the recess or indentation 208 at an associated hinge assembly (i.e., the hinge assembly depicted in FIG. 2D). Accordingly, in this configuration or position, a contact surface 258 of the stand component 214 may rest or sit upon an underlying surface (not shown), such as a tabletop or a desk. As such, portable electronic device 100 is propped or placed upward from the underlying surface at an angle. In this way, a display and/or user interface surface (e.g., the display surface 114 of the embodiment depicted in FIG. 1A) of the portable electronic device 100 is readily viewable by a user at this propped up and angled position.

Figure 4:
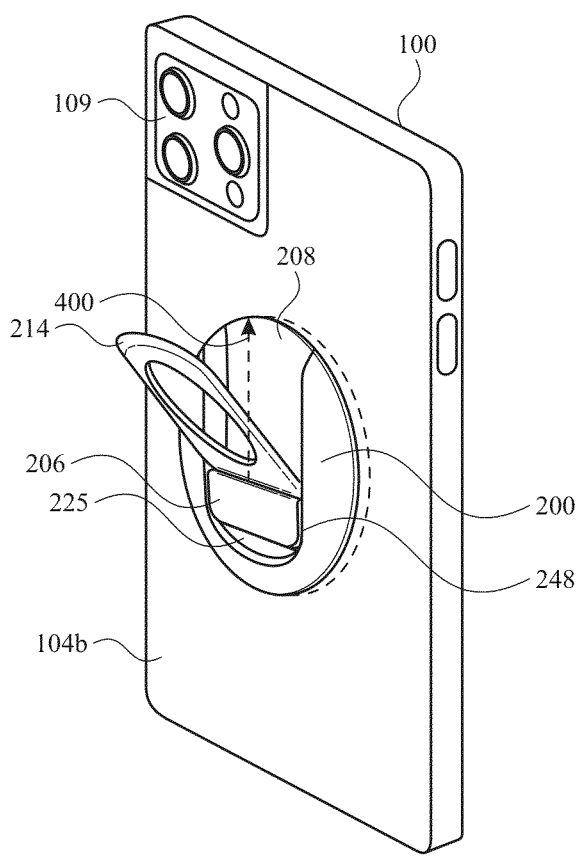
FIG. 4 illustrates an isometric view of the multi-part clip of FIG. 2A, in which the multi-part clip is coupled to the portable electronic device of FIG. 1A.
Figures 5A, 5B:
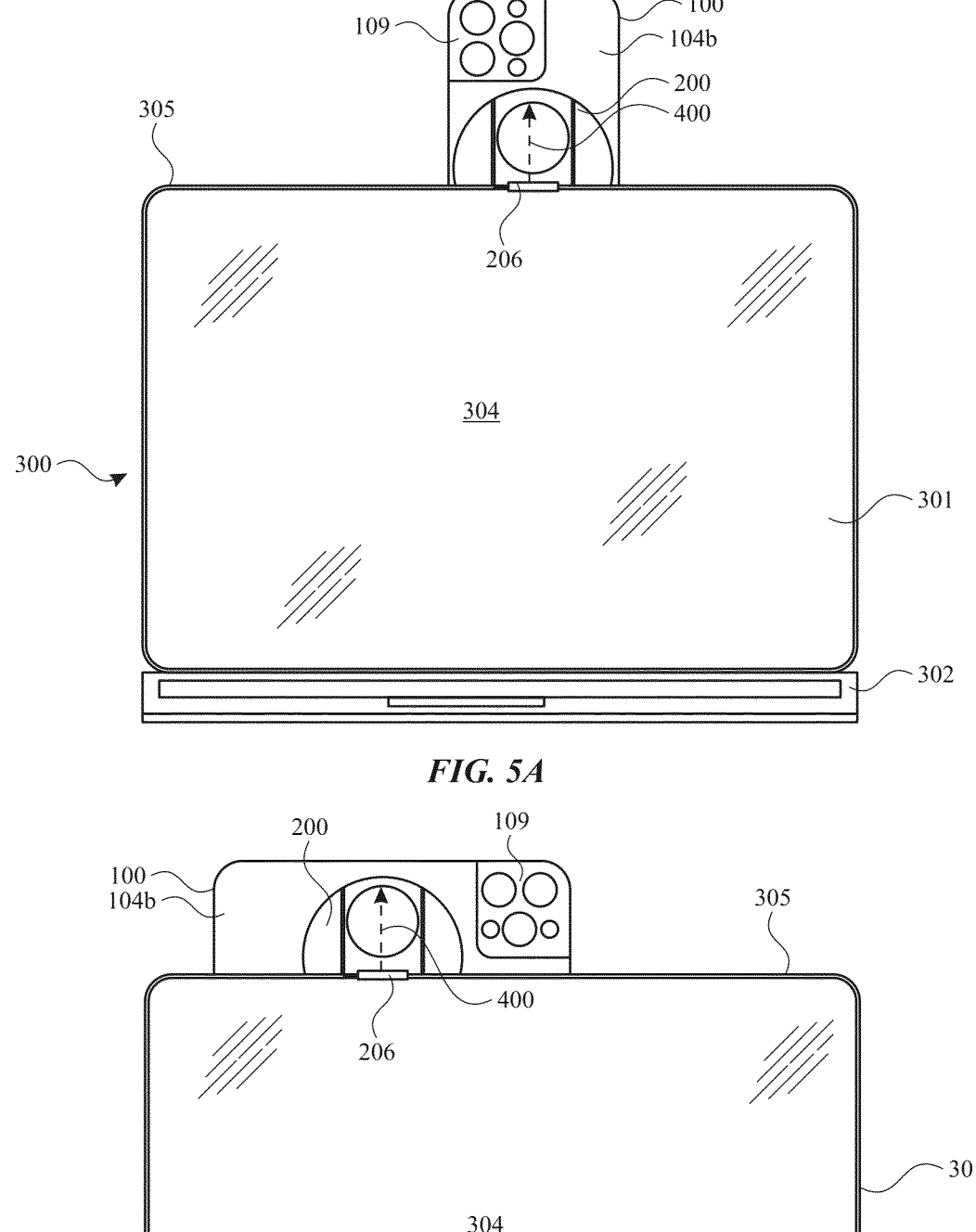
FIG. 5A illustrates the multi-part clip of FIG. 2A seated at and/or on a separate electronic computing device, wherein the multi-part clip is coupled to the portable electronic device of FIG. 1A while the portable electronic device is in a portrait orientation.
FIG. 5B illustrates the multi-part clip of FIG. 2A seated at and/or on a separate electronic computing device, wherein the multi-part clip is coupled to the portable electronic device of FIG. 1A while the portable electronic device is in a landscape orientation.
Figure 6:
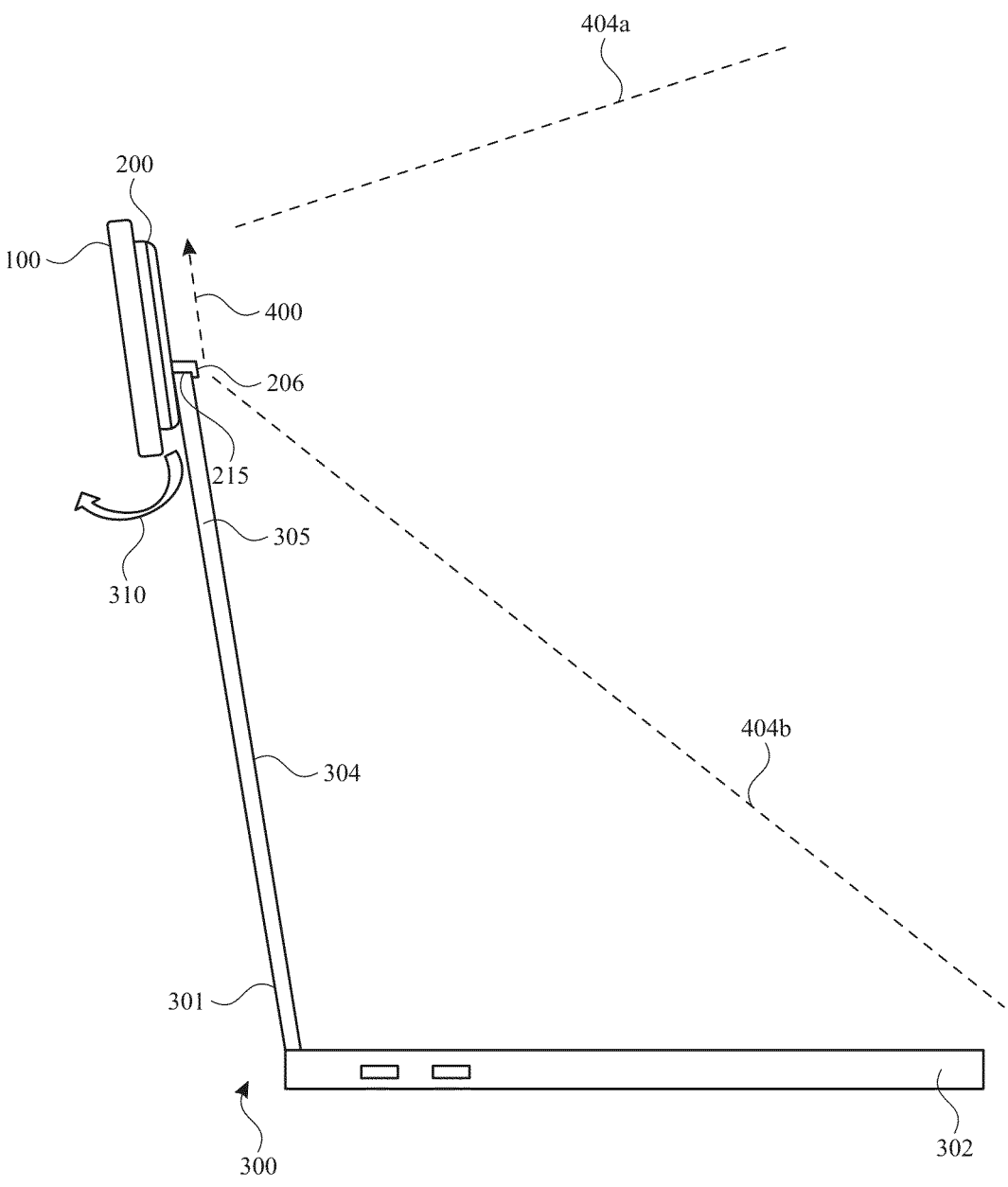
FIG. 6 illustrates a side view of the multi-part clip of FIG. 2A seated at and/or on a separate electronic computing device, wherein the multi-part clip is coupled to the portable electronic device of FIG. 1A while the portable electronic device is in a landscape orientation.

With reference to FIGS. 4, 5A-5B, and 6, there is depicted a function of hook-like appendage or projection 206, in accordance with an exemplary embodiment thereof. As demonstrated in FIGS. 5A, 5B and 6, the hook-like appendage or projection 206 allows for the multi-part clip 200 and, by extension, a portable electronic device (e.g., the portable electronic device 100 of FIGS. 1A and 1B) supported therein, to be seated at or upon an underlying supporting surface. In the example shown in FIGS. 5A, 5B, and 6, the underlying supporting surface is an electronic computing device 300 (e.g., a laptop device). According to this specific embodiment, electronic computing device 300 includes a top (or first) component 301 that is rotatably coupled to a base (or second) component 302. Further, as indicated in FIGS. 5A, 5B, and 6, top component 301 comprises a display surface 304. In addition, base component 302 comprises one or more user input or interaction modalities that could include, but are not limited to, a keyboard. Accordingly, the views shown in FIGS. 5A and 5B are from the viewpoint or perspective of a user positioned before (or in front of) the electronic computing device 300 and looking head-on to the display surface 304. As shown in FIG. 5A, the hook-like appendage or projection 206 of the multi-part clip 200 is in an actuated or deployed configuration or position and seated upon a horizontal edge 305 (e.g., a top edge) of the electronic computing device 300. In the depiction in FIG. 5A, the portable electronic device 100 is oriented with respect to multi-part clip 200 such that the portable electronic device is positioned in a vertical (or a portrait) configuration or position relative to the user. Further, by way of multi-part clip 200, a (back) surface 104b of the portable electronic device 100 is positioned towards and facing the user, including the camera lens assembly 109. With respect to FIG. 5B, it depicts the identical scene from the same perspective set forth in FIG. 5A, with the only exception being that the portable electronic device 100 is now oriented in a horizontal (or a landscape) configuration or position relative to the user.

Referring now to FIG. 6, there is shown a side view of the depiction in FIG. 5B. As indicated, the hook-like appendage or projection 206 of multi-part clip 200 is seated upon the horizontal edge 305 of electronic computing device 300.

Specifically, horizontal edge 305 is received within a recess 215 of the hook-like appendage or projection 206. As mentioned above, according to this view, the multi-part clip 200 is supporting a portable electronic device 100 positioned in a horizontal (or landscape) orientation. As depicted, multi-part clip 200 and, by extension, the portable electronic device 100, may also be pivoted in situ and about the hinge assembly that is associated with the hook-like appendage or projection 206 in the direction of arrow 310. Therefore, angular adjustments may be made with respect to the angle occurring between the portable electronic device 100 and the electronic computing device 300 (e.g., with respect to top component 301) and, as such, the angle occurring between the portable electronic device 100 and the user. In other words, in addition to being able to change the orientation of portable electronic device between a horizontal and a vertical orientation, portable electronic device may also be tilted towards and away from the user in situ.

Importantly, as best seen in FIG. 6, the multi-part clip 200 relies entirely on the gravitational force or gravitational pull on the multi-part clip 200 (and, by extension, portable electronic device 100) to anchor or otherwise secure the hook-like appendage or projection 206 atop the electronic computing device 300.

Further, it should be noted that, according to the particular embodiment depicted in FIGS. 2A-2H, a relative position of hook-like appendage or projection 206 with respect to the housing 202 of multi-part clip 200 may be determined or chosen by design according to certain factors or specific variables. For example, as indicated in FIG. 4, the placement of the hinge assembly (including hinge pin 248) associated with the hook-like appendage or projection 206 dictates which portion of a portable electronic device supported therein will be covered or otherwise obscured by an underlying supporting surface (e.g., the electronic computing device 300 in the embodiment depicted in FIGS. 5A, 5B, and 6) at which the hook-like appendage or projection 206 is seated. Therefore, this placement of the associated hinge assembly may be determined in such a manner to ensure that no function, or a specific function, of a portable electronic device is effectively disrupted by being covered or obscured by the underlying supporting surface. Further, as shown in FIG. 4, this placement of the hook-like appendage or projection 206 may also be defined as equal to a longest distance or length 400 of the stand component 214. Thus, as demonstrated in FIGS. 5A, 5B, and 6, a magnitude of this distance or length 400 may be determined such that, for example, camera lens assembly 109 of portable electronic device 100 is not obscured by the top (first) component 301 of electronic computing device 300 in situ, irrespective of whether portable electronic device 100 is in a horizontal or a vertical orientation. Also according to this particular embodiment, an additional factor may be considered in determining the relative position of hook-like appendage or projection 206. As shown in FIG. 6, it may be desired that portable electronic device 100 be positioned such that a frame (indicated in FIG. 6 as delineated by an uppermost height 404a and a lowermost height 404b) of any image or video captured by the camera lens assembly 109 does not inadvertently include any portion of the underlying supporting surface (e.g., any portion of the electronic computing device 300). Thus, distance or length 400 may also be specifically determined or chosen based on this factor.

Figure 7A:
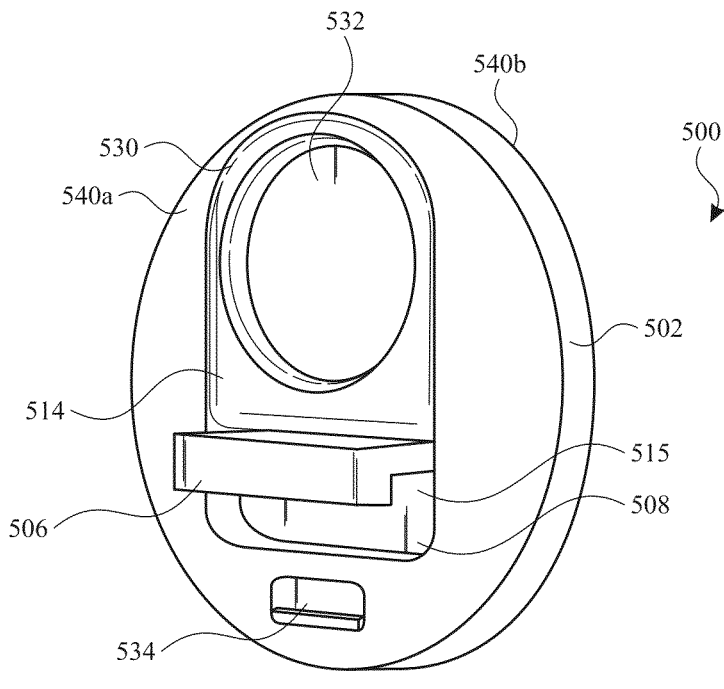
FIGS. 7A-7B illustrate an alternative embodiment of a multi-part clip.
Figure 7B:
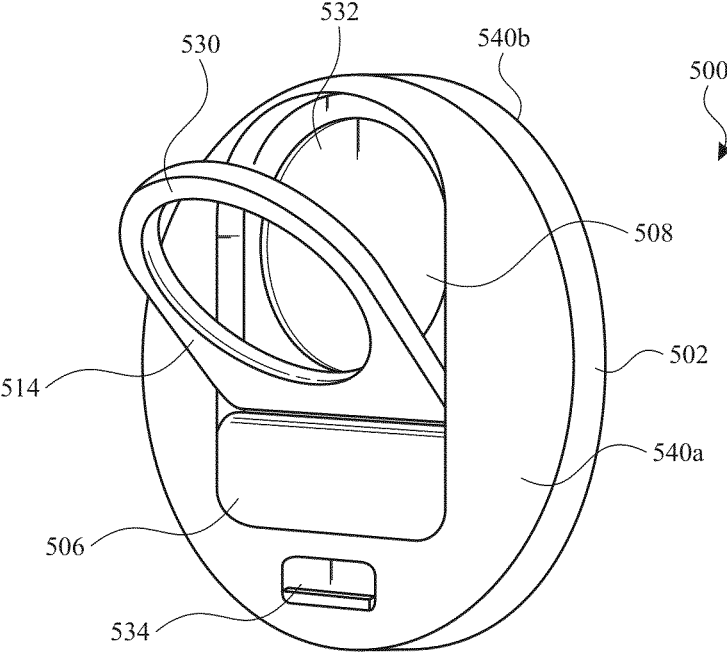

Referring now to FIGS. 7A and 7B, there is depicted an alternative exemplary embodiment of a multi-part clip 500. As shown, multi-part clip 500 comprises a housing 502. Further, housing 502 includes a first housing surface 540a and a second housing surface 540b. Similar to the embodiment of a multi-part clip 200 depicted in FIGS. 2A-2H, a recess or indentation 508 is formed in the first housing surface 540a. Further, a stand component 514 and a hook-like appendage or projection 506 are positioned within, and are pivotably attached or affixed to, an interior region 532 of recess or indentation 508 by, for example, respective hinge assemblies (not shown). In addition, the stand component 514 may be in the form of a graspable pull-tab ring 530. As shown in FIG. 7A, in an actuated or deployed configuration or position thereof, the hook-like appendage or projection 506 is pivoted outward or away from recess or indentation 208. A recess 515 of the hook-like appendage or projection 506 is configured to receive an underlying supporting surface such that the multi-part clip 500 is seated at or on the underlying supporting surface. Additionally, as shown in FIG. 7B, the stand component 514 is likewise pivoted outward or away from the recess or indentation 508 when in its actuated or deployed configuration. In the same manner as the multi-part clip 200 depicted in FIGS. 2A through 2H, the housing 502 of the multi-part clip 500 includes a circular, ring-like magnetic element (not shown) therein. Accordingly, in order to secure multi-part clip 500 (at the second housing surface 540b) to a portable electronic device (e.g., the portable electronic device 100 of FIGS. 1A-1B), the magnetic element of multi-part clip 500 is aligned with magnetic element 112 of the portable electronic device 100, thereby resulting in a releasable magnetic engagement or attachment between the multi-part clip 500 and the portable electronic device 100. In contrast to the embodiment of the multi-part clip 200 depicted in FIGS. 2A-2H, a release button 534 is configured to release the hook-like appendage or projection 506 from an unactuated or seated configuration or position (that is pictured in FIG. 7B) to an actuated or deployed configuration or position (as is pictured in FIG. 7A) by, for example, overcoming a spring-loaded biasing force at a hinge assembly associated with the hook-like appendage or projection 506.

Figures 8A, 8B:
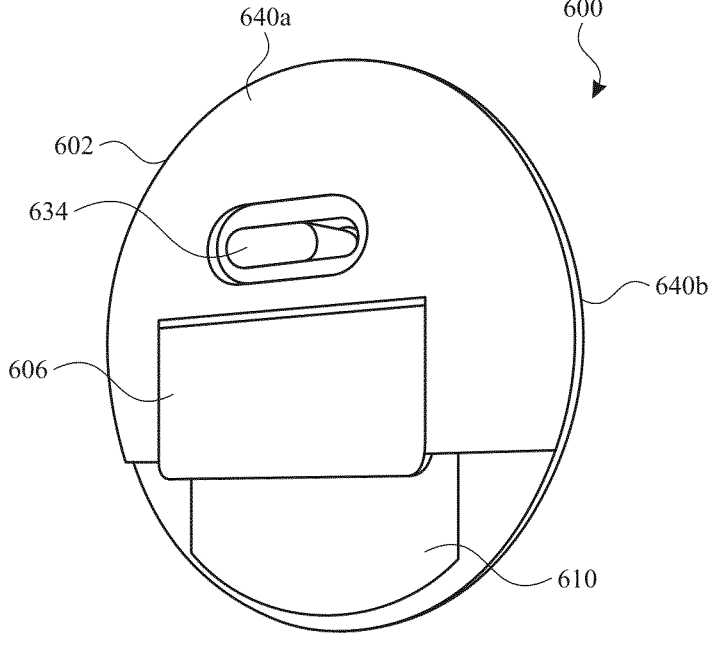
FIGS. 8A-8B illustrate an alternative embodiment of a multi-part clip.

With respect to FIGS. 8A and 8B, there is illustrated an alternative exemplary embodiment of a multi-part clip 600. The multi-part clip 600 includes a housing 602 that comprises a first housing surface 640a and a second housing surface 640b. Further, housing 602 includes a circular, ring-like magnetic element (not shown) therein, which is configured to align with a magnetic element 112 of a portable electronic device (e.g., the portable electronic device 100) such that the multi-part clip 600 is secured (via the resulting magnetic engagement or attachment) at the portable electronic device 100 by way of second housing surface 640b. In addition, the multi-part clip 600 includes a hook-like appendage or projection 606 pivotably coupled to the first housing surface 640a. Further, the hook-like appendage or projection 606 is structurally coupled to a stand component 610 such that when the hook-like appendage or projection 606 is pivoted outward or away from the first housing surface 640a, the stand component 610 is also pivoted in tandem with the hook-like appendage or projection 606 (as depicted in FIG. 8B). In a similar manner to the multi-part clip 200 described above with respect to FIGS. 2A-2H, hook-like appendage or projection 606, when in an actuated or deployed configuration or position in which it is pivoted outward or away from the first housing surface 640a, is configured to sit at or upon an underlying supporting surface (e.g., the electronic computing device 300). Accordingly, when hook-like appendage or projection 606 is in an actuated or deployed configuration or position, the stand component 610 may also come into contact with a portion of the underlying supporting surface, thereby creating an angular displacement of the multi-part clip 600 with respect to the underlying support surface. Therefore, the multi-part clip 600 is capable of a consistent angular position (or a tilt) in a direction that is towards or away a user in situ. Further, multi-part clip 600 includes a release button 634 that, when manually pushed or depressed, releases hook-like appendage or projection 606 from an unactuated or seated configuration or position (that is pictured in FIG. 8A) into an actuated or deployed configuration or position (pictured in FIG. 8B), wherein hook-like appendage or projection 606 may be spring-loaded.

Referring now to FIGS. 9A-9C, there is shown an alternative exemplary embodiment of a multi-part clip 700. As depicted, the multi-part clip 700 comprises a housing 702 that has a first housing surface 740a and a second housing surface 740b. Further, a recess or indentation 708 is formed within first housing surface 740a. In addition, a stand component 714 and a hook-like appendage or projection 706 are pivotably attached or affixed to an interior region of recess or indentation 708. FIG. 9A depicts the stand component 714 in an unactuated or seated configuration or position within recess or indentation 708, and the hook-like appendage or projection 706 in an actuated or deployed position. FIG. 9C provides a side view of the configuration shown in FIG. 9A. Further, FIG. 9B illustrates the stand component 714 in an actuated or deployed configuration or position and, in addition, depicts hook-like appendage or projection 706 in an unactuated or seated configuration or position. With respect to its operation, multi-part clip 700 operates in a similar manner to the multi-part clip 200 of FIGS. 2A through 2H described above.

With respect to FIGS. 10A-10C, there is illustrated an alternative exemplary embodiment of a multi-part clip 800. As depicted, multi-part clip 800 comprises a housing 802 that has a first housing surface 840a and a second housing surface 840b. Further, a recess or indentation 808 is formed within the first housing surface 840a. In addition, a stand component 814 and a hook-like appendage or projection 806 are pivotably attached or affixed to an interior region of recess or indentation 808. FIG. 10A depicts both stand component 814 and hook-like appendage or projection 806 in an unactuated or seated configuration or position within the recess or indentation 808. FIG. 10B depicts stand component 814 in an unactuated or seated configuration or position within recess or indentation 808, and the hook-like appendage or projection 806 in an actuated or deployed position. FIG. 10C provides a side view of the configuration shown in FIG. 10B. With respect to its operation, the multi-part clip 800 operates in a similar manner to multi-part clip 200 of FIGS. 2A through 2H described above with the exception that, upon reaching a certain extent of its actuated or deployed position (e.g., at 90 degrees with respect to the first housing surface 840a), hook-like appendage or projection 806 structurally engages a support 834. When engaged by hook-like appendage or projection 806, support 834 is pivoted outward from the first housing surface 840a. When pivoted outward, support 834 may come into contact with a portion of an underlying supporting surface at which the multi-part clip 800 is seated, thereby creating an angular displacement of multi-part clip 800 with respect to the underlying support surface in situ.

Figure 11A:
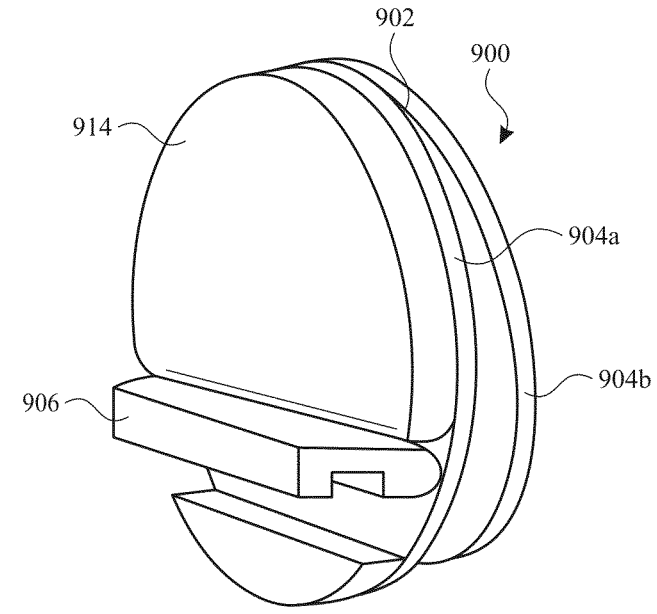
FIGS. 11A-11B illustrate an alternative embodiment of a multi-part clip.
Figure 11B:
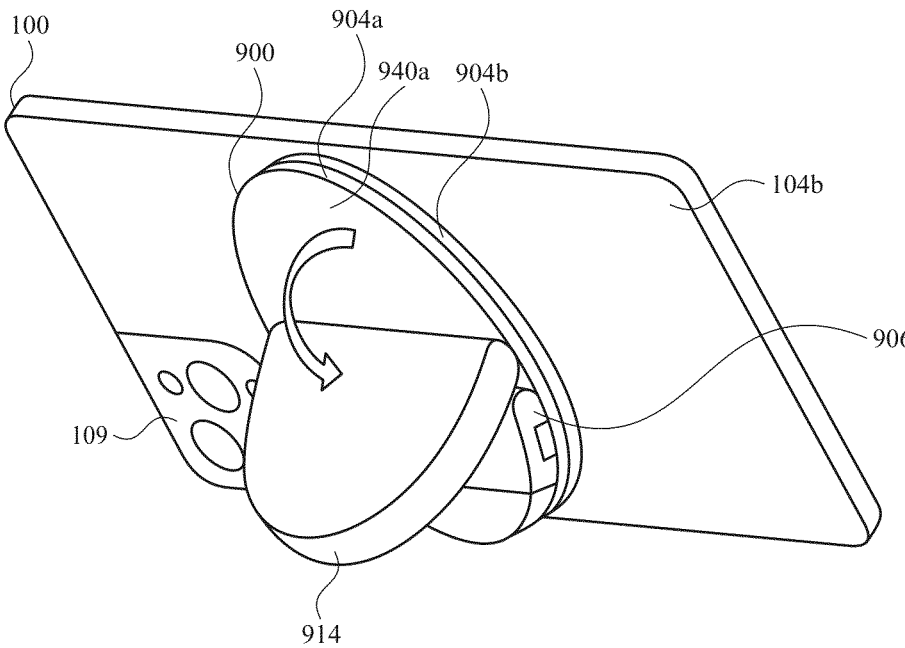

Referring now to FIGS. 11A and 11B, there is illustrated an alternative exemplary embodiment of a multi-part clip 900. As depicted, the multi-part clip 900 comprises a housing 902 that has a first housing part 904a and a second housing part 904b. In addition, a stand component 914 and a hook-like appendage or projection 906 are pivotably attached or affixed to a surface 940a of the first housing part 904a. With respect to its operation, multi-part clip 900 operates in a similar manner to the multi-part clip 200 of FIGS. 2A through 2H described above.

Referring now to FIGS. 12A-12C, there is depicted an alternative exemplary embodiment of a multi-part clip 1000. As shown, the multi-part clip 1000 comprises a housing 1002 that has a first housing surface 1040a and a second housing surface 1040b. Further, the housing 1002 comprises a circular, ring-like magnetic element (not shown) that is configured to align with a magnetic element 112 of a portable electronic device (e.g., the portable electronic device 100 of FIGS. 1A and 1B), thus creating a magnetic engagement or attachment between second housing surface 1040b and the portable electronic device. In addition, a stand component 1010 and a hook-like appendage or projection 1006 are pivotably attached or affixed to the first housing surface 1040a by way of a hinge assembly 1018. FIGS. 12A and 12B depict both the stand component 1010 and hook-like appendage or projection 1006 in their respective actuated or deployed configurations or positions in which they are each pivoted outward or away from first housing surface 1040a. In a similar manner to multi-part clip 200 described above, hook-like appendage or projection 1006 is configured to receive a portion of an underlying supporting surface within a recess 1015 such that multi-part clip 1000 is then seated or rests upon the underlying support surface by way of gravitational force or gravitational pull. However, additionally, when pivoted outward, a support 1034 of stand component 1010 may come into contact with a portion of the underlying support surface, thereby creating an angular displacement of multi-part clip 1000 with respect to the underlying support surface in situ.

Figure 13A:
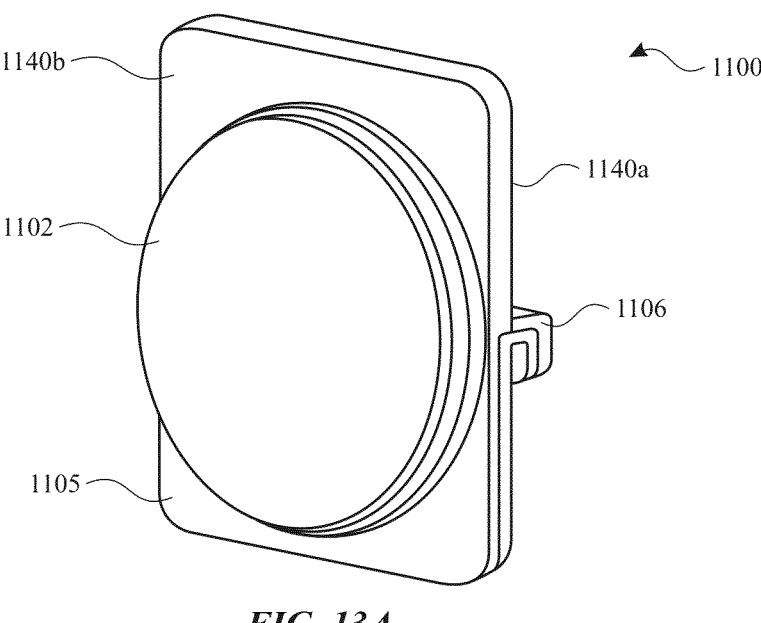
FIGS. 13A-13B illustrate an alternative embodiment of a multi-part clip.
Figure 13B:
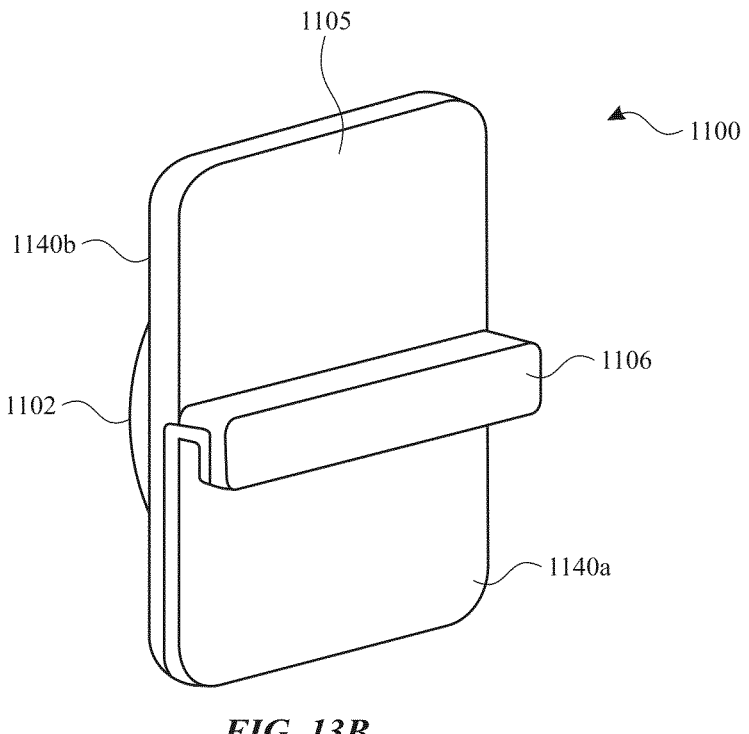

With respect to FIGS. 13A and 13B, there is depicted an alternative exemplary embodiment of a multi-part clip 1100. As shown, multi-part clip 1100 has a first housing part 1105 and a second housing part 1102. In addition, the first housing part 1105 comprises a first housing surface 1140a and a second housing surface 1140b. Further, second housing part 1102 comprises a circular, ring-like magnetic element (not shown) that is configured to align with a magnetic element 112 of a portable electronic device (e.g., the portable electronic device 100 of FIGS. 1A and 1B), thereby creating a magnetic engagement or attachment between the second housing part 1102 and the portable electronic device. Also, a hook-like appendage or projection 1106 is formed at, or coupled to, the first housing surface 1140a of the first housing part 1105, wherein hook-like appendage or projection 1106 is configured to sit or rest upon an underlying supporting surface in a manner that is similar to hook-like appendage or projection 206 of the multi-part clip 200 described above with respect to FIGS. 2A through 2H.

Referring now to FIGS. 14A-14C, there is depicted an alternative exemplary embodiment of a multi-part clip 1200. As shown, the multi-part clip 1200 comprises a first part 1204a and a second part 1204b, wherein the first part 1204a and the second part 1204b may be formed from a single fabricated piece that is, for example, molded into the shape that is depicted in FIG. 14A. Further, the first part 1204a and the second part 1204b are positioned in parallel to one another in a folder configuration, thereby forming a trough or recess 1210 therebetween. Accordingly, in order to secure multi-part clip 1200 to a portable electronic device, the portable electronic device is received within the trough or recess 1210 and is seated or clasped within the trough or recess 1210 by way of gravitational force or gravitational pull. Further, the first part 1204a includes a hook-like appendage or projection 1206 that protrudes away from first part 1204a. The hook-like appendage or projection 1206 is configured to receive a portion of an underlying supporting surface (e.g., electronic computing device 300 described above) within a recess 1215, such that multi-part clip 1200 is seated or rests upon the received underlying supporting surface in situ by way of gravitational force or gravitational pull. In addition, hook-like appendage or projection 1206 may comprise a spring clamp 1206a (see FIG. 14C) that is configured to impart a biasing force (in the direction of arrow A), thereby compressing the underlying supporting surface and, as a result, further securing the multi-part clip 1200 to the underlying supporting surface.

With respect to FIGS. 15A-15C, there is shown an alternative exemplary embodiment of a multi-part clip 1300. According to this particular embodiment, the multi-part clip 1300 is comprised of a housing 1302, wherein the housing 1302 has a first housing surface 1340a and a second housing surface 1340b. Housed within housing 1302 is a circular, ring-like magnetic element (not shown) that is configured to align with a magnetic element 112 of a portable electronic device 100, thereby creating a magnetic engagement between the portable electronic device and the second housing surface 1340b of housing 1302. Coupled to first housing surface 1340a is a clasp assembly 1308. The clasp assembly 1308 includes a first part 1310 placed in parallel to a second part 1312, wherein the first part 1310 and the second part 1312 are coupled together by a knob 1306. Further, the first part 1310 is movable with respect to the second part 1312 by way of knob 1306. As demonstrated in FIGS. 15B and 15C, actuation of knob 1306 according to a first direction is capable of moving first part 1310 towards second part 1312. Conversely, actuation of knob 1306 according to a second direction that is opposite the first direction is capable of moving the first part 1310 away from the second part 1312. Therefore, a width of a gap 1315 existing between first part 1310 and the second part 1312 may be adjusted according to movement of the knob 1306. Thus, knob 1306 may be used to manually grasp a portion of an underlying supporting surface within gap 1315, thereby securing the multi-part clip 1300 to the underlying supporting surface.

Referring now to FIGS. 16A and 16B, there is depicted an alternative exemplary embodiment of a multi-part clip 1400. As shown in FIG. 16A, the multi-part clip 1400 has a housing 1402, wherein housing 1402 comprises a first housing part 1404a and a second housing part 1404b. According to this particular embodiment, the first housing part 1404a comprises a suction element configured to temporarily attach or couple to a suitable contact surface of an underlying supporting surface (e.g., electronic computing device 300) by way of a suction force. Further, the second housing part 1404b comprises a circular, ring-like magnetic element (not shown) configured to align with a magnetic element 112 of a portable electronic device 100, thereby creating a magnetic engagement between the portable electronic device and the second housing part 1404b of housing 1402. In addition, as demonstrated in FIG. 16B, second housing part 1404b is capable of rotating with respect to the remainder of the housing 1402, thereby allowing for an adjustment in the relative position (e.g., the relative height) of the supported portable electronic device 100 with respect to the multi-part clip 1400.

Referring now to FIGS. 17A and 17B, there is depicted an alternative exemplary embodiment of a multi-part clip 1500. This particular embodiment is identical to the multi-part clip

1400 of the embodiment just described above with respect to FIGS. 16A and 16B, with the exception of a further feature 1510. Feature 1510 is a registration or an orientation feature that operates to abut an underlying supporting surface, thereby providing a consistent alignment of multi-part clip 1500 with the underlying support surface.

With respect to FIGS. 18A-18C, there is shown an alternative exemplary embodiment of a multi-part clip 1600, wherein multi-part clip 1600 comprises a housing 1602. Similar to the embodiments of FIGS. 16A-16B and 17A-17B, multi-part clip 1600 is configured to attach to an underlying supporting surface by way of a suction element 1604 and includes a registration or orientation feature 1606. Further, a first housing part 1608 of housing 1602 may comprise a circular, ring-shaped magnetic element (not shown) that is configured to align with a magnetic element 112 of a portable electronic device 100, thereby creating a magnetic engagement or attachment between the portable electronic device and the multi-part clip 1600. In addition, housing 1602 includes a second housing part 1605 that operates to lock and release the suction element 1604 with respect to the underlying supporting surface.

Figure 19A:
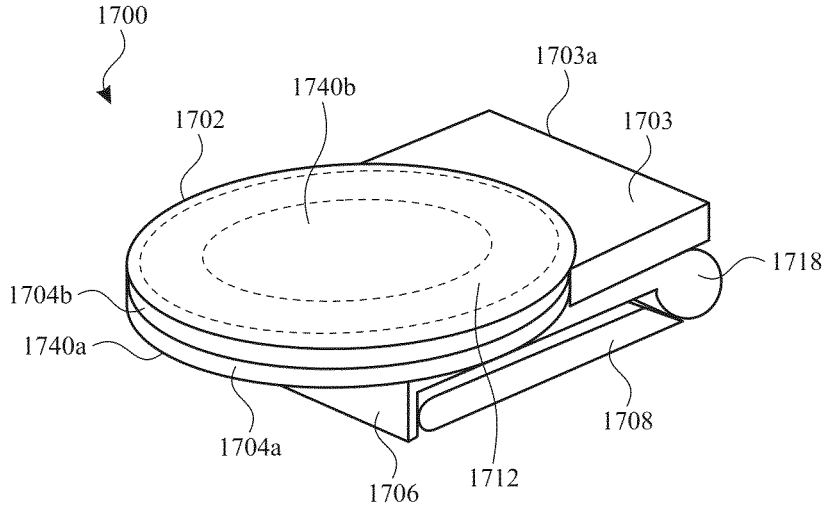
FIGS. 19A-19B illustrate an alternative embodiment of a multi-part clip.
Figure 19B:
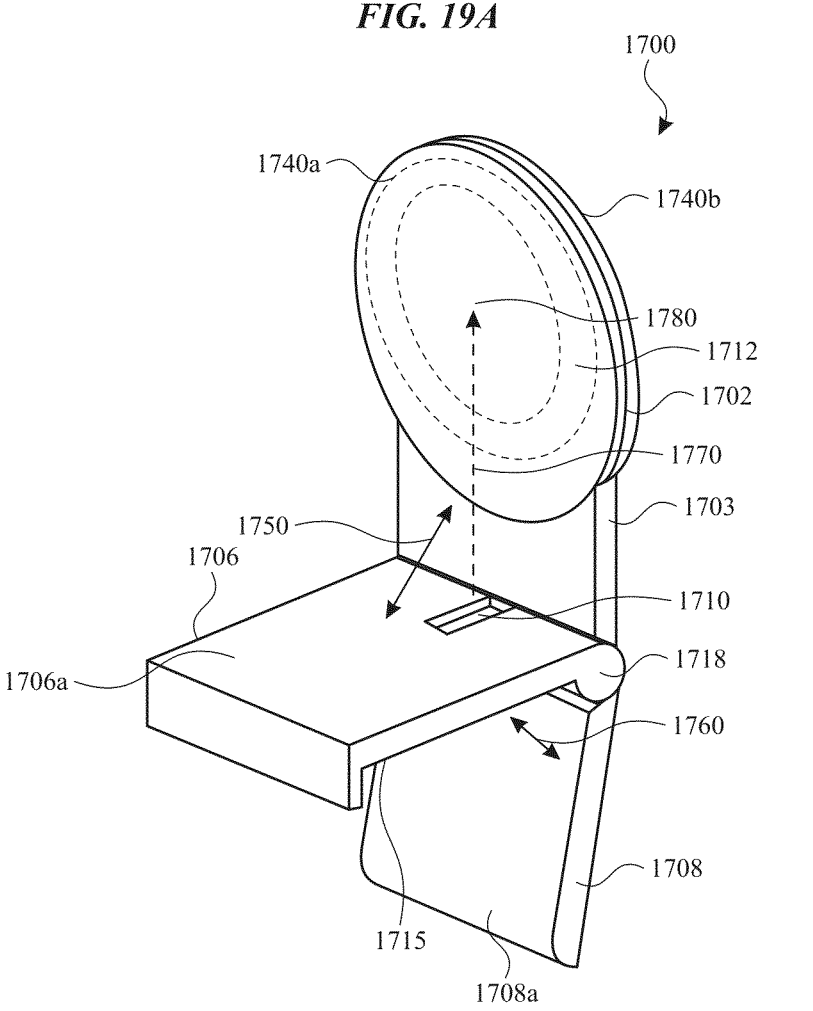

Referring now to FIGS. 19A and 19B, there is depicted an exemplary embodiment of a multi-part clip 1700. As described in greater detail below, this specific embodiment is particularly suitable for supporting a portable electronic device with respect to an underlying supporting surface that has one or more non-flat or variable surfaces. As shown, the multi-part clip 1700 includes a housing 1702, wherein housing 1702 comprises a first housing part 1704a positioned in parallel to and coupled to a second housing part 1704b. Further, the first housing part 1704a has a first exterior housing surface 1740a. Similarly, the second housing part 1704b has a second exterior housing surface 1740b. In addition, within the housing 1702 is a circular, ring-shaped magnetic element 1712 that is configured to align with a magnetic element 112 of a portable electronic device 100, thereby creating a magnetic engagement or attachment between portable electronic device 100 and the second exterior housing surface 1740b of multi-part clip 1700.

The multi-part clip 1700 further comprises a stand component 1708 and a hook-like appendage or projection 1706. As depicted, both the stand component 1708 and the hook-like appendage or projection 1706 are pivotably coupled, or affixed, to a terminating end 1703a of an extension 1703 of housing 1702, by way of a hinge assembly 1718 that is common to both the stand component 1708 and the hook-like appendage or projection 1706. Accordingly, when pivoted about the hinge assembly 1718, the stand component 1708 and the hook-like appendage or projection 1706 are either both advancing towards each other or are both moving away from each other. Depicted in FIG. 19A is a collapsed or retracted configuration or position of multi-part clip 1700 in which stand component 1708 and hook-like appendage or projection 1706 are fully pivoted towards each other such that they are parallel and adjacent to each other. Also, the stand component 1708 and hook-like appendage or projection 1706 are completely pivoted towards the housing 1702 such that the stand component 1708, the hook-like appendage or projection 1706, and the housing 1702 are parallel to each other. Accordingly, when the multi-part clip 1700 is not in use, this collapsed or retracted configuration or position allows for the multi-part clip 1700 to assume a compact and slim shape, size, and profile.

Conversely, FIG. 19B depicts the multi-part clip 1700 in an actuated or deployed configuration or position that is ready for use. Specifically, hook-like appendage or projection 1706 is pivoted away from the housing 1702, thereby defining an angle 1750 between a first surface 1706a of hook-like appendage or projection 1706 and the first exterior housing surface 1740a of first housing part 1704a. Further, the stand component 1708 is pivoted away from the hook-like appendage or projection 1706, thereby defining an angle 1760 between the stand component 1708 and the hook-like appendage or projection 1706. In this actuated or deployed configuration or position, a recess 1715 of the hook-like appendage or projection 1706 is sufficiently exposed such that it may receive a portion of an underlying supporting surface.

Accordingly, FIGS. 20A and 20B depict the multi-part clip 1700 in situ, wherein the multi-part clip 1700 is magnetically engaged or attached to a portable electronic device 100. Further, the hook-like appendage or projection 1706 is seated atop an underlying supporting surface 1800. In this particular depiction, the underlying supporting surface 1800 comprises a front (or first) surface 1802a, a back (or second) surface 1802b positioned opposite of the front surface 1802a, and a horizontal (or top) edge 1805. Accordingly, the underlying supporting surface 1800 may comprise, for example, a free-standing computer or television monitor. Therefore, from the perspective of a user, the user is likely facing the front surface 1802a while engaging with the underlying supporting surface 1800. Also, it should be noted for purposes of the below discussion that, as indicated in FIG. 20A, unlike the front surface 1802a of underlying supporting surface 1800, the back surface 1802b is non-flat or variable such that it projects away at an angle from the front surface 1802a. Referring still to FIGS. 20A and 20B, hook-like appendage or projection 1706 is seated atop the horizontal edge 1805 of the underlying supporting surface 1800. Further, a terminating edge 1708a of the stand component 1708 of the multi-part clip 1700 is in contact with the back surface 1802b of the underlying supporting surface 1800. Accordingly, the surface-to-surface contact between stand component 1708 and back surface 1802b of underlying supporting surface 1800 provides additional support that is needed to balance the multi-part clip 1700 atop the underlying supporting surface 1800. That is to say, in this particular embodiment, the variable, non-flat back surface 1802b of the underlying supporting surface 1800 is leveraged in order to increase the stability of the multi-part clip 1700 in a counterbalance to the gravitational force that urges the multi-part clip 1700 in a downward direction. In addition, as described below, the stand component 1708 allows for stable and sturdy adjustments to the angular displacement (or the tilt) of the housing 1702 of the multi-part clip 1700 (and, by extension, the portable electronic device 100) with respect to the user.

In the depiction provided in FIGS. 20A and 20B, portable electronic device 100 is positioned in a vertical (or portrait) orientation from the perspective of a user. In addition, the portable electronic device 100 is oriented at an angle 1750 that is approximately 90° degrees relative to the horizontal edge 1805 of monitor 1800. Proceeding to FIGS. 21A and 21B, the depiction therein of the multi-part clip 1700 is nearly identical to the depiction that is set forth in FIGS. 20A and 20B, with the exception that the housing 1702 is tilted towards the user such that the portable electronic device 100 is now oriented at an angle 1750 that is less than 90° degrees relative to the horizontal edge 1805 of monitor 1800. Thus, the contact between the stand component 1708 and the non-flat (or angled) back surface 1802b of monitor 1800 provides a toughened pivot point by which housing 1702 of the multi-part clip 1700 may be pivoted about the hinge assembly 1718.

Figure 22A:
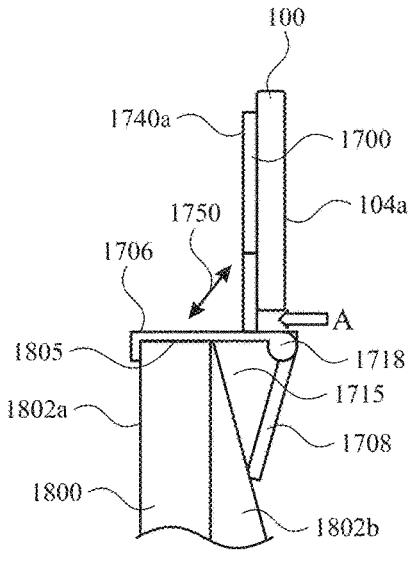
FIG. 22A illustrates a side view of the multi-part clip of FIG. 19A, wherein the multi-part clip is seated at and/or on a separate electronic computing device and coupled to the portable electronic device of FIG. 1A while the portable electronic device is in a landscape orientation.
Figure 22B:
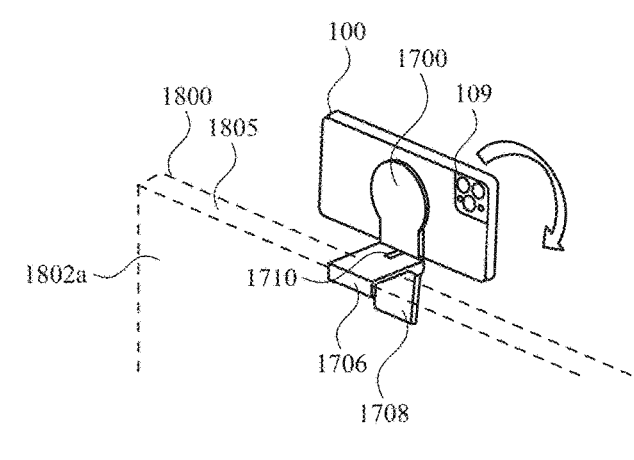
FIG. 22B illustrates a perspective view of the multi-part clip of FIG. 22A, in situ.

Referring now to FIGS. 22A and 22B, there is depicted the portable electronic device 100 now in a horizontal (or landscape) orientation from the perspective of the user. Again, as described above with respect to the multi-part clip 200 of the embodiment shown in FIGS. 2A through 2H, this adjustment between a vertical and horizontal orientations of the portable electronic device 100 while in situ and without requiring that the portable electronic device 100 first be disengaged from the multi-part clip is made possible by the alignment and magnetic characteristics of the magnetic element 112 of the portable electronic device 100 and/or the magnetic element of the multi-part clip (e.g., magnetic elements 212 and 1712).

Further, in FIGS. 22A and 22B, the housing 1702 of the multi-part clip 1700 is positioned such that the portable electronic device 100 is oriented at an angle 1750 of approximately 90° degrees relative to the horizontal edge 1805 of monitor 1800. By contrast, in FIGS. 23A and 23B, the housing 1702 is tilted or pivoted towards the user such that portable electronic device 100 is oriented at an angle 1750 that is less than 90° degrees relative to the horizontal edge 1805 of monitor 1800.

It should also be noted that a distance or length 1770 the lies between the hook-like appendage or projection 1706 and a center point 1780 of the circular, ring-shaped magnetic element 1712 of the multi-part clip 1700 may be determined according to several factors. For example, the distance or length 1770 may be determined to ensure that no functional part, or a selected functional part, of the portable electronic device is not obscured by any portion of the housing 1702 or the underlying supporting surface. Further, the distance or length 1770 may be chosen to ensure that any image or video frame captured by the portable electronic device does not inadvertently include any portion of the underlying supporting surface.

Figure 23A:
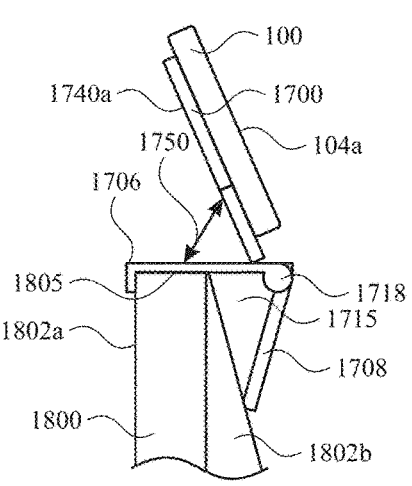
FIG. 23A illustrates a side view of the multi-part clip of FIG. 22A, wherein the multi-part clip is tilted at an angle.
Figure 23B:
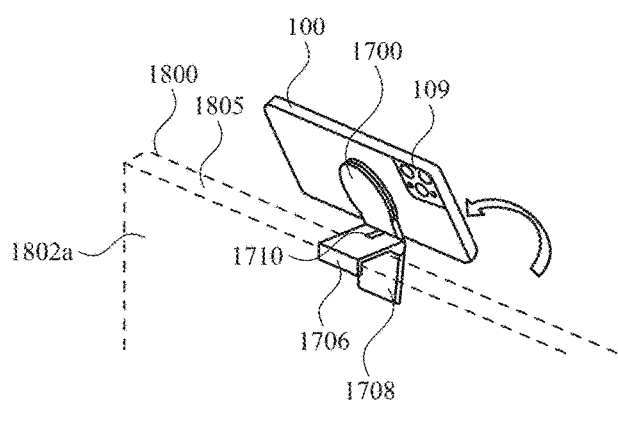
FIG. 23B illustrates a perspective view of the multi-part clip of FIG. 23A, in situ.

Lastly, it should also be noted that, with respect to the embodiment of the multi-part clip 1700, positioning a portable electronic device 100 in a vertical (or portrait) orientation may require that a bottom portion of the portable electronic device can be situated behind the back surface 1802b, as shown in FIGS. 20A-20B and FIGS. 21A-21B. To ensure that this rearward placement of the portable electronic device 100 is possible, a track or notch 1710 may be formed in, for example, a surface 1706a of the hook-like appendage or projection 1706. Surface 1706a may be the topmost surface of the hook-like appendage or projection 1706 that faces upwards and/or towards the direction of housing 1702. Further, the track or notch 1710 may be formed along a center region of surface 1706a. According to certain embodiments, the housing 1702 is configured to slide along the track in a direction towards the hinge assembly 1718 and in the opposite direction away from the hinge assembly 1718. Thus, as shown in, for example, FIGS. 20A and 21A, the housing 1702 may be shifted along track 1710 such that, from the perspective of the user, it is positioned at a distal-most position of the track 1710. As a result, the bottom portion of portable electronic device 100 is able to effectively clear and sit behind the top or horizontal edge 1805 of the monitor 1800 when the portable electronic device 100 is in a vertical (or portrait) orientation. However, by contrast, as depicted in FIGS. 22A and 23A, while the portable electronic device in a horizontal (or landscape) orientation, the housing 1702 may be shifted in a proximal direction (i.e., in the direction of arrow A) along track 1710 as, in some embodiments, it is now no longer necessary that a portion of the portable electronic device 100 must be situated on a back side of the underlying supporting surface 1800 to achieve an optimal orientation.

According to some embodiments of the present disclosure, a multi-part clip is described. The multi-part clip may be configured to support a portable electronic device with respect to an electronic computing device. The multi-part clip includes a multi-part housing, wherein the multi-part housing includes: (i) a first housing part having a first surface, (ii) a second housing part coupled to the first housing part and having a second surface opposite the first surface, and (iii) an internal volume. In addition, the multi-part clip includes a magnetic element disposed within the internal volume and configured to form, through the second surface, a magnetic attachment to a magnetic element of a portable electronic device. Further, the multi-part clip includes a hook-like appendage pivotably coupled to the first surface and comprising a recess such that, in an actuated configuration of the hook-like appendage, the hook-like appendage extends away from the first surface and the recess is configured to receive a portion of an electronic computing device such that the multi-part clip is balanced atop the electronic computing device according to a gravitational force being imparted on the multi-part clip. Also, according to some embodiments of the present disclosure, the multi-part housing is in a shape of a circular disc. Further, the hook-like appendage is pivotably coupled to the first surface by a hinge assembly. Additionally, according to certain embodiments of the present disclosure, the first surface of the first housing part comprises a housing recess having an interior region, and the hook-like appendage is pivotably coupled to the interior region of the housing recess such that, when in an unactuated configuration, the hook-like appendage is fully seated within the housing recess. Further, according to certain embodiments of the present disclosure, the multi-part clip further comprises a support stand positioned adjacent to the hook-like appendage and pivotably coupled to the interior region of the housing recess such that: (i) in an unactuated configuration, the support stand is fully seated within the housing recess, and (ii) in an actuated configuration, the support stand extends away from the first surface. In addition, according to certain embodiments of the present disclosure, the magnetic element comprises a set of discrete magnets disposed in a ring shape.

According to certain exemplary embodiments of the present disclosure, there is described a multi-part clip for receiving a portable electronic device having a magnetic element. The multi-part clip may include a first part that includes: (i) a planar support portion capable of directly supporting the portable electronic device, wherein the planar support portion is defined, in part, by opposite first and second edges, (ii) a lip support portion capable of providing lip support to the planar support portion, wherein the lip support portion extends away from and perpendicular to the planar support portion at the first edge, and (iii) a notch that extends through the planar support portion from the second edge to a center portion of the planar support portion. In addition, the multi-part clip may include a second part pivotably coupled to the planar support portion at the second edge, wherein the second part is capable of providing, in concurrence with the lip support, an adjustable angular support such that the planar support portion is perpendicular to a reference orientation. Further, the multi-part clip may include an attachment pail having a body having (i) a first portion, (ii) a second portion that includes a first magnetic element, and (iii) a tab coupled to the first portion and movable within the notch, wherein when the tab moves within the notch, the second portion is capable of movement that is: (i) parallel to the planar support portion and (ii) aligned with only a portion of the portable electronic device corresponding to the magnetic element. In addition, according to some embodiments of the present disclosure, the portable electronic device includes a camera assembly. Also, according to certain embodiments of the present disclosure, the planar support portion is capable of supporting the camera assembly in the reference orientation. Further, according to some embodiments of the present disclosure, the planar support portion is supported by a display housing of a display screen of a computer. In addition, according to some embodiments of the present disclosure, the reference orientation is generally perpendicular to the display screen. Also, according to certain embodiments of the present disclosure, the reference orientation is generally adjustable in relation to the display screen.

According to some exemplary embodiments of the present disclosure, there is described a multi-part clip for supporting a portable electronic device having a magnetic element. The multi-part clip may include a first part that includes a planar support portion that is defined, in part, by an edge, wherein the planar support portion is capable of providing support to the portable electronic device, the planar support portion having a notch that extends from the edge to a center portion of the planar support portion. Further, the multi-part clip may include a second part that is pivotably coupled to the planar support portion at the edge, wherein the second part is capable of providing an adjustable angular support to the planar support portion. In addition, the multi-part, clip includes an attachment part having a body that includes (i) a first portion having a first magnetic element, and (ii) a second portion, coupled to the first portion, that includes an alignment feature sized to fit and move within the notch in a manner parallel to the planar support portion such that the first magnetic element is aligned with the magnetic element. Further, according to certain embodiments of the present disclosure, the multi-part clip further comprises a lip support portion capable of providing lip support to the planar support portion, wherein lip support portion extends away from and perpendicular to the planar support portion at the edge, and WO a notch that extends through the planar support portion from the edge to a center portion of the planar support portion. Also, in some embodiments of the present disclosure, the second part is capable of providing, in concurrence with the lip support, an adjustable angular support such that the planar support portion is perpendicular to a reference orientation. Further, according to certain embodiments of the present disclosure, the alignment feature is a tab that is coupled to the first portion and is movable within the notch, wherein when the tab moves within the notch, the second portion is capable of movement that is: (i) parallel to the planar support portion and (ii) aligned with only a portion of the portable electronic device corresponding to the magnetic element. Additionally, according to some embodiments of the present disclosure, the planar support, portion is perpendicular to a reference orientation. Also, according to certain embodiments of the present disclosure, the planar support portion may be supported by a display housing of a display screen of a computer. Further, according to certain embodiments of the present disclosure, the reference orientation is generally perpendicular to the display screen.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings. For example, although the magnetic elements described above are generally characterized as having a circular, ring-like shape, such magnetic elements may comprise any suitable shape and dimensions that permits the multi-part clip 200 to provide the function(s) described herein. Such exemplary shapes may include a closed rounded shape, rectangular shape, square shape, oval shape, etc. Further, for purposes of the present disclosure, the term "ring-like" may be used interchangeably with the term "annular".

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A multi-part clip for supporting a portable electronic device at an electronic computing device, comprising:
 a multi-part housing comprising:
  a first housing part having a first surface;
  a second housing part coupled to the first housing part and having a second surface opposite the first surface; and
  an internal volume;

a magnetic element disposed within the internal volume and configured to form, through the second surface, a magnetic attachment to a magnetic element of a portable electronic device; and
 an appendage pivotably coupled to the first surface and comprising a recess such that, in an actuated configuration, the appendage extends away from the first surface and the recess is configured to receive a portion of an electronic computing device such that the multi-part clip is balanced atop the electronic computing device according to a gravitational force being imparted on the multi-part clip.

2. The multi-part clip as recited in claim 1, wherein the multi-part housing is in a shape of a circular disc.

3. The multi-part clip as recited in claim 1, wherein the appendage is pivotably coupled to the first surface by a hinge assembly.

4. The multi-part clip as recited in claim 1, wherein:
 the first surface of the first housing part further comprises a housing recess having an interior region; and
 the appendage is pivotably coupled to the interior region of the housing recess such that, when in an unactuated configuration, the appendage is fully seated within the housing recess.

5. The multi-part clip as recited in claim 4, further comprising a support stand positioned adjacent to the appendage and pivotably coupled to the interior region of the housing recess such that:
 in an unactuated configuration, the support stand is fully seated within the housing recess; and
 in an actuated configuration, the support stand extends away from the first surface.

6. The multi-part clip as recited in claim 1, wherein the magnetic element comprises a set of discrete magnets disposed in a ring shape.

* * * * *